United States Patent [19]

Agrawal et al.

[11] Patent Number: 5,231,588
[45] Date of Patent: Jul. 27, 1993

[54] PROGRAMMABLE GATE ARRAY WITH LOGIC CELLS HAVING SYMMETRICAL INPUT/OUTPUT STRUCTURES

[75] Inventors: Om P. Agrawal, San Jose, Calif.; Michael J. Wright, Boulder, Colo.

[73] Assignee: Advanced Micro Devices, Inc., Sunnyvale, Calif.

[21] Appl. No.: 514,297

[22] Filed: Apr. 25, 1990

Related U.S. Application Data

[60] Continuation-in-part of Ser. No. 442,528, Nov. 27, 1989, which is a division of Ser. No. 394,221, Aug. 15, 1989.

[51] Int. Cl.$^5$ .................. H03K 17/693; G06F 15/20
[52] U.S. Cl. ..................... 364/489; 364/488; 364/716; 340/825.83; 307/465
[58] Field of Search ............... 364/488, 489, 490, 491, 364/716; 307/465, 465.1; 340/825.79, 825.83

[56] References Cited

U.S. PATENT DOCUMENTS

| | | | |
|---|---|---|---|
| 4,642,487 | 2/1987 | Carter | 307/465 |
| 4,688,072 | 8/1987 | Heath et al. | 364/491 |
| 4,706,216 | 11/1987 | Carter | 365/94 |
| 4,713,557 | 12/1987 | Carter | 307/242 |
| 4,758,985 | 7/1988 | Carter | 365/94 |
| 5,036,473 | 7/1991 | Butts et al. | 364/490 |
| 5,126,950 | 6/1992 | Rees et al. | 364/490 |

OTHER PUBLICATIONS

"The XC4000 Logic Cell Array Family-Data Book" Published by XILINX, 1991, pp. 1-64.
"The XC4000 Logic Cell Array Family-Technical Data" published by XILINX, 1990, pp. 1-53.
"On-Chip RAM and Hierarchical Routing Improve Programmable-Array Flexibility" by D. Burky, Electronic Design, Jul. 12, 1990, pp. 35-36.
"Third-Generation Architecture Boosts Speed and Density of Field-Programmable Gate Arrays" by P. Alfke, XILINX, Jun. 1990, pp. 1-12.
"The Programmable Gate Array Design Handbook"; 1st Ed.; published by XILINX, pp. 1-1 to 1-31.
"XC3000 Logic Cell Array Family"; published by XILINX; pp. 1-31 (FIG. 15b).

*Primary Examiner*—Vincent N. Trans
*Attorney, Agent, or Firm*—Fliesler, Dubb, Meyer & Lovejoy

[57] ABSTRACT

A configurable logic array includes an array of configurable logic cells arranged in columns and rows. A plurality of input/output cells are arranged around the perimeter of the array, and provide interfaces to input/output pads on the chip. A configurable interconnect structure includes vertical buses between the columns of configurable logic cells, and horizontal buses between the rows of configurable logic cells. Thus, each configurable logic cell in a subset of the array, has four adjacent buses in the interconnect structure. The configurable logic cells in this subset of the array include input structures, having programmable inputs connected to the buses on all four sides of the cell. Also, combinational logic connected to the input structure generates logic signals in response to the selected input signals. Finally, the configurable logic cells include output structures connected to the combinational logic, and having programmable outputs connected to the buses on all four sides of the cell.

19 Claims, 16 Drawing Sheets

NOTATION FOR BUSES 1 TO 9

| VERTICAL BUS | |
|---|---|
| 1 | LONG LINE |
| 2 | LONG LINE |
| 3 | LONG LINE |
| 4 | LONG LINE |
| 5–9 10–14 | BIDIRECTIONAL GENERAL INTERCONNECT |
| 15 | LONG LINE CLOCK |
| 16 | GK |
| 17 | GR |
| 18–25 | UNCOMMITTED LONG LINES |

| HORIZONTAL BUS | |
|---|---|
| 1 | LONG LINE |
| 2 | LONG LINE |
| 3 | LONG LINE |
| 4 | LONG LINE |
| 5–9 10–14 | BIDIRECTIONAL GENERAL INTERCONNECT |
| 15 | LONG LINE CLOCK |
| 16–23 | UNCOMMITTED LONG LINES |

CLB INPUT MUX'ING

GENERAL PURPOSE CONTROL LINES IN CLBS

CLB MUX'ING

3RD LEVEL MUXING

4TH LEVEL MUXING

SPECIAL OUTPUT MUX CONTROL

PROGRAMMABLE GATE ARRAY WITH LOGIC CELLS HAVING SYMMETRICAL INPUT/OUTPUT STRUCTURES

CONTINUING APPLICATION DATA

The present application is a continuation-in-part of U.S. patent application Ser. No. 07/442,528, filed Nov. 27, 1989, entitled PROGRAMMABLE GATE ARRAY WITH IMPROVED CONFIGURABLE LOGIC BLOCK, which is the divisional of U.S. patent application Ser. No. 07/394,221, filed Aug. 15, 1989, entitled PROGRAMMABLE GATE ARRAY WITH IMPROVED INTERCONNECT STRUCTURE.

BACKGROUND OF THE INVENTION

1. Field of the Invention

The present invention relates to programmable gate arrays which include an array of configurable logic cells, a plurality of input/output cells, and a configurable interconnect structure. More particularly, the present invention relates to programmable gate arrays with logic cells having symmetrical connection to the interconnect structure.

2. Description of Related Art

The programmable gate array (PGA) is a high performance, user programmable device containing three types of configurable elements that are customized to a user's system design. The three elements are (1) an array of configurable logic blocks (CLBs), (2) with input/output blocks (IOBs) around a perimeter, all linked by (3) a flexible programmable interconnect structure.

The system design desired by a user is implemented in the device by configuring programmable RAM cells. These RAM cells control the logic functionality performed by the CLBs, IOBs and the interconnect. The configuration is implemented using PGA design software tools.

It is generally accepted that the programmable gate array was first, successfully, commercially introduced by Xilinx of San Jose, Calif. Xilinx originally introduced the XC2000 series of logic cell arrays and has more recently introduced a second generation XC3000 family of integrated circuit programmable gate arrays. A description of the 2000 series, as well as related programmable logic device art, can be found in THE PROGRAMMABLE GATE ARRAY DESIGN HANDBOOK, First Edition, published by Xilinx, pages 1—1 through 1-31. The architecture for the XC3000 family is provided in a technical data handbook published by Xilinx entitled XC3000 LOGIC CELL ARRAY FAMILY, pages 1—31. Each of these Xilinx publications is incorporated by reference in this application as providing a description of the prior art.

The prior art in programmable gate arrays is further exemplified by U.S. Pat. Nos. 4,642,487; 4,706,216; 4,713,557; and 4,758,985; each of which is assigned to Xilinx, Inc. These U.S. Patents are incorporated by reference as setting forth detailed descriptions of the programmable gate array architecture and implementations of the same.

As mentioned above, the programmable gate array consists of a configurable interconnect, a ring of configurable input/output blocks, and an array of configurable logic blocks. It is the combination of these three major features that provides flexibility and data processing power for programmable gate arrays. However, the programmable gate arrays of the prior art suffer certain limitations in each of the interconnect structure, the input/output block structures, and the configurable logic block structures.

One limitation suffered by programmable gate arrays rises from the difficulty in programming networks using logic blocks which do not have symmetrical inputs and outputs. In the prior art, the inputs and outputs were directional through the configurable logic blocks. Thus, as a network developed, it tended to proceed across the array in a direction which would not efficiently utilize the resources on the chip. Also, because of the directional tendency enforced by the configurable logic blocks, the difficulty of programming the device to utilize the available resources effectively was limited, and required exceedingly complex routines.

SUMMARY OF THE INVENTION

The present invention provides a configurable logic cell for a configurable logic device, which has symmetrical input and output structures. In particular, the configurable logic cell has inputs and outputs coupled to buses of the interconnect structure on four sides of the block.

Thus, according to one aspect of the invention, a configurable logic array is provided. The configurable logic array includes an array of configurable logic cells arranged in columns and rows. A plurality of input/output cells are arranged around the perimeter of the array, and provide interfaces to input/output pads on the chip. A configurable interconnect structure includes vertical buses between the columns of configurable logic cells, and horizontal buses between the rows of configurable logic cells. Thus, each configurable logic cell in a subset of the array, has four adjacent buses in the interconnect structure. The configurable logic cells in this subset of the array include input structures, having programmable inputs connected to the buses on all four sides of the cell, for supplying input signals selected in response to program data in the configuration memory. Also, combinational logic, connected to the input structure, generates logic signals in response to the selected input signals and program data in the configuration memory. Finally, the configurable logic cells include output structures connected to the combinational logic, and having programmable outputs connected to the buses on all four sides of the cell, for supplying output signals selected from the logic signals in response to program data in the configuration memory.

The architecture of the configurable logic cell having inputs and outputs on all four sides according to the present invention has a variety of manifestations. In particular, the output structure, according to one aspect, includes four independent output macrocells, independently programmable for supplying output signals to respective buses in the interconnect structure.

According to another aspect, the combinational logic generates logic signals as a function of three variables, four variables, five variables, and six variables, and the output structure selects independently output signals for each of the programmable outputs connected to the four buses, from independent sets of logic signals, where each independent set includes logic signals generated as a function of four, of five and of six variables.

According to another aspect, the combinational logic generates a wide-gate logic signal in a special output stage. Each of the independent sets of logic signals from which output signals are selected for all four buses, include the wide-gate logic signal.

According to another aspect, at least one input signal is coupled to the output structure independent of the combinational logic. This input signal can be supplied through the cell to an opposite bus on the configurable interconnect structure. In one embodiment, signals can be passed through the logic cell in this way, from left to right, right to left, top to bottom and bottom to top. Further, the input signals can be stored in registers in output macrocells coupled to the respective buses.

According to yet another aspect of the invention, the configurable interconnect buses each include a respective plurality of long lines extending across the array. The input structures in each member of a subset of the configurable logic cells includes programmable inputs connected to all of the long lines in the plurality in the buses on all four sides of the cell. Similarly, the output structure includes programmable outputs connected to all of the long lines in the plurality on the four adjacent buses.

Further, each of the buses in the configurable interconnect structure includes a plurality of uncommitted long lines which extend across the array. The output means in each member of a subset of the configurable logic cells includes programmable outputs connected to all uncommitted long lines in the buses on all four sides of the cell.

The four sided input/output structure and uniform arrangement of input/output structures in the configurable logic cells, according to the present invention, simplify the task of programmers attempting to efficiently utilize the resources of the chip, by allowing programming to proceed in any direction through any cell on the chip.

Other aspects and advantages of the present invention can be seen upon review of the drawings, the detailed description and the claims that follow.

DETAILED DESCRIPTION

Figure 26:
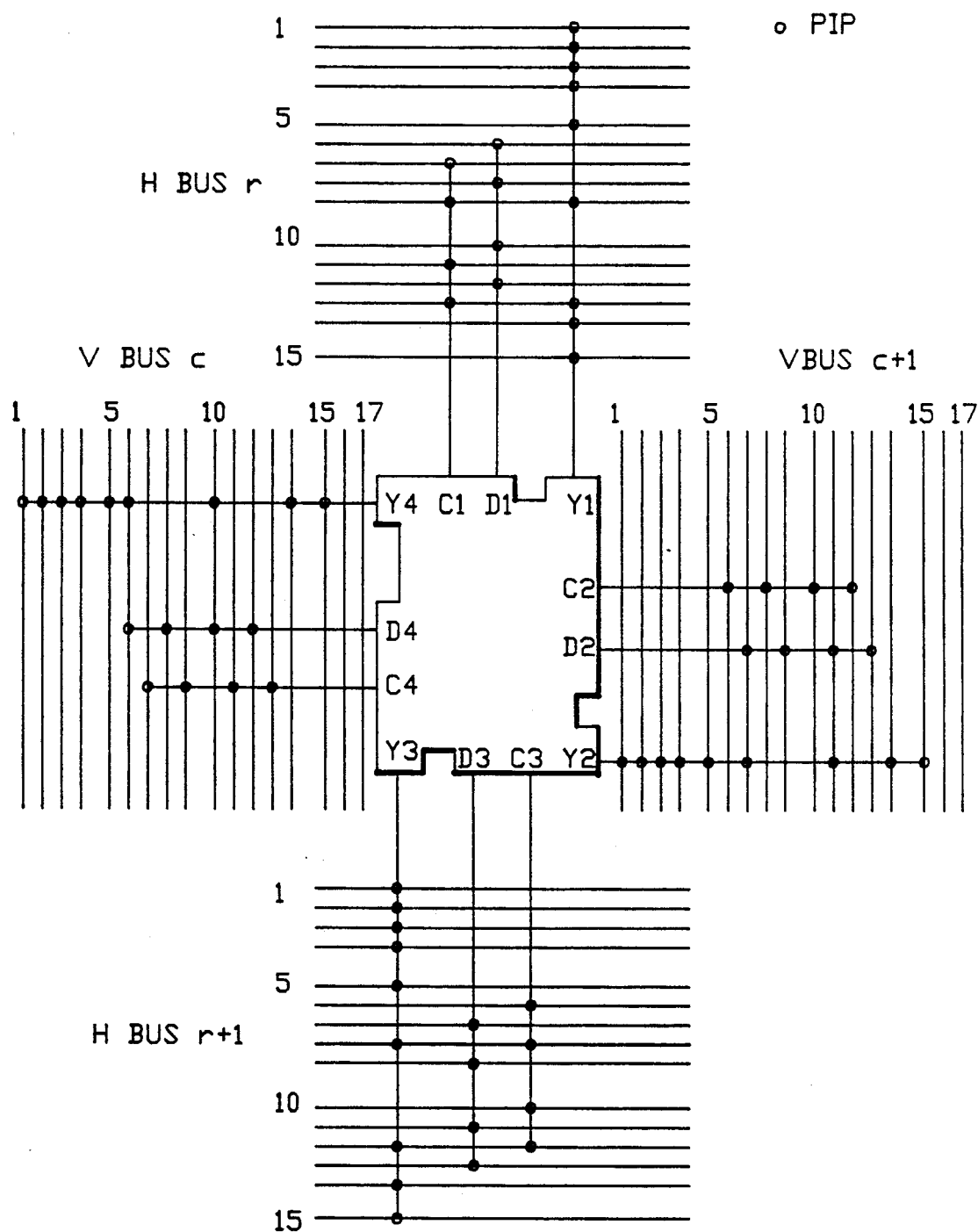
FIG. 26 illustrates connections through programmable interconnect points of the outputs Y1 through Y4 of a configurable logic block to adjacent buses in the interconnect structure, as well as connections to the inputs C1 through C4 and D1 through D4.
Figure 27:
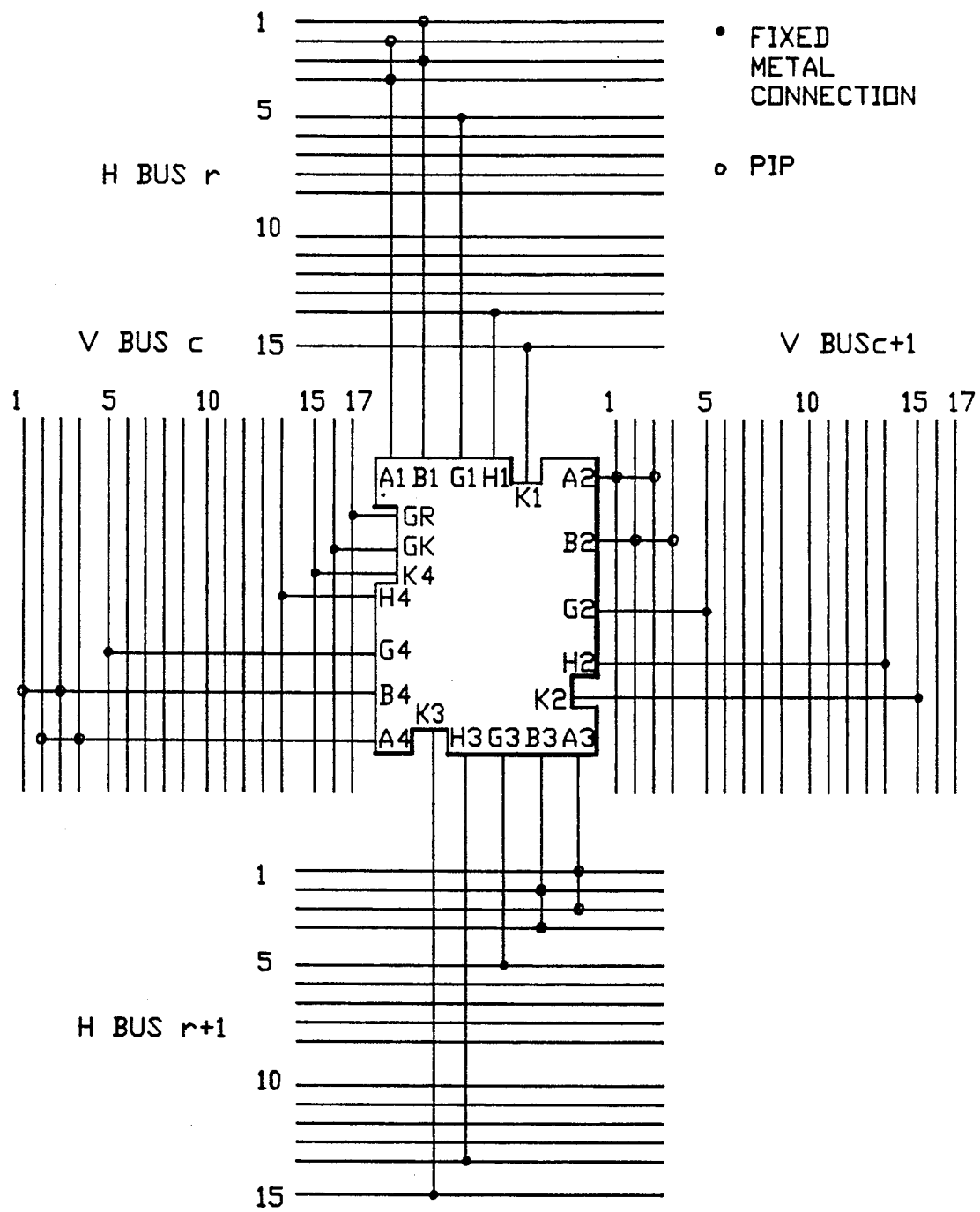
FIG. 27 illustrates the programmable connections from the long lines in adjacent buses to the inputs A1 through A4 and B1 through B4 of the configurable logic block, as well as fixed connections to various other inputs on the CLB.
Figure 28:
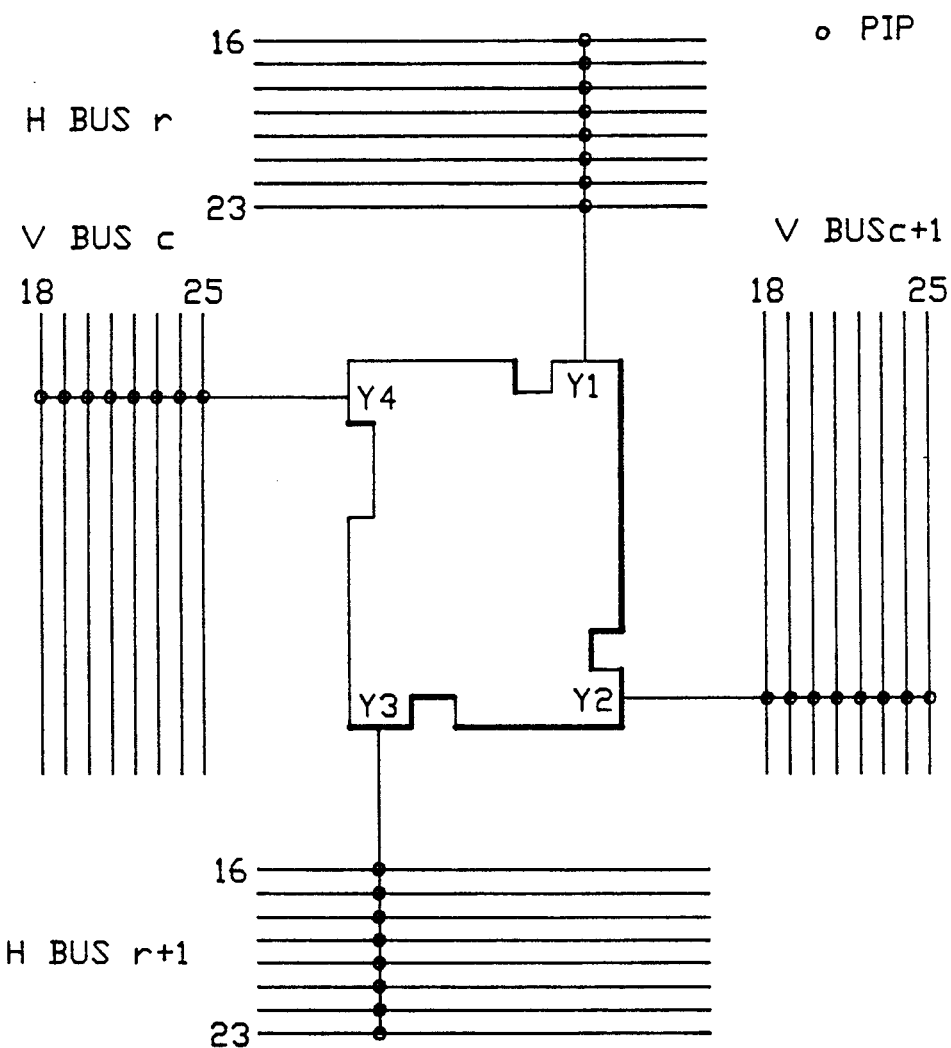
FIG. 28 illustrates the programmable connections of the outputs Y1 through Y4 to the uncommitted long lines in the adjacent buses according to the present invention.

A detailed description of a preferred embodiment of the present invention is provided with reference to the Figures. First, the layout and programming structure of the chip is described with reference to FIGS. 1-4. Next, a detailed description of the implementation of the configurable logic cell according to the present invention is provided with reference to FIGS. 5-25. Finally, FIGS. 26-28 illustrate symmetrical connections of the configurable logic cell to the adjacent buses in the interconnect structure.

Further information concerning the architecture of the configurable logic array according to the present invention can be found in the parent application, Ser. No. 07/442,528, which is incorporated by reference.

I. LAYOUT AND PROGRAMMING STRUCTURE

Figure 1:
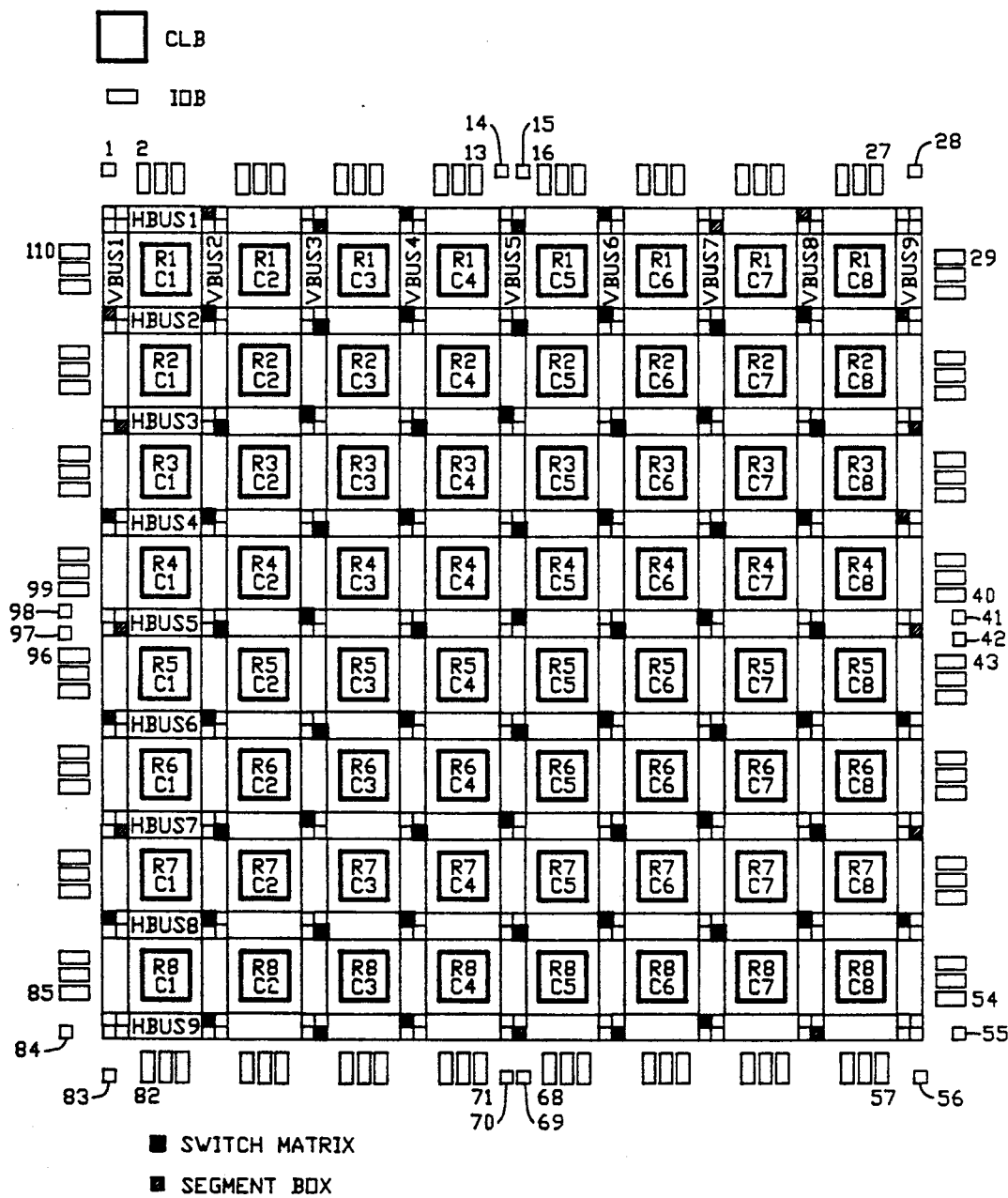
FIG. 1 is a schematic diagram of a programmable gate array structure according to the present invention.

FIG. 1 illustrates the layout of the programmable gate array according to the present invention. Also provided in FIG. 1 is a notation which is utilized to describe the programmable gate array in this application. Accordingly, the programmable gate array shown in FIG. 1 consists of an array of configurable logic blocks illustrated by the square symbol with bold lines shown at the upper left hand corner of the figure. Each configurable logic block in the array is labeled with a row and column number, i.e. in the upper left hand corner of the array, the configurable logic blocks are labeled R1C1, R1C2, and so on until the lower right hand corner of the array where the configurable logic block is labeled R8C8.

Around the periphery of the array are 110 pads for connection to external pins. Pads 2-13, 16-27, 29-40, 43-54, 57-68, 71-82, 85-96 and 99-110 are coupled to configurable input/output blocks represented by the symbol shown in the upper left corner of the figure. Pads 1, 14, 15, 28, 41, 42, 55, 56, 69, 70, 83, 84, 79 and 98 are utilized for functions other than configurable input/output blocks, such as power, ground, global clock and reset signal inputs, and programming mode control signals. The connection of these miscellaneous pads is similar to that done in prior art programmable gate array and is not further described here.

The interconnect structure consists of nine horizontal buses labeled HBUS1 through HBUS9 with nine intersecting vertical buses VBUS1 through VBUS9. The intersections of vertical bus 1 and vertical bus 9 with the horizontal buses 2-8 are characterized by having segment boxes which provide programmable interconnection between the respective horizontal buses and vertical buses as described in detail below. Likewise, the intersections of horizontal bus 1 and horizontal bus 9 with vertical buses 2-8 are characterized by segment boxes providing the programmable interconnection between the horizontal and vertical buses.

The intersections of the vertical buses 2-8 with the horizontal buses 2-8 are characterized by switching matrices providing for interconnection between the respective horizontal and vertical buses. The placement of the segment boxes and switching matrices is schematically illustrated in FIG. 1 using the symbols illustrated in the lower left hand corner of the figure.

The programmable gate array according to the present invention contains three types of configurable elements that are customized to a user system design which is specified in a configuration memory. The three configurable elements are the array of configurable logic blocks (CLBs), the configurable input/output blocks (IOBs) around the perimeter, and the programmable interconnect network.

The system design of a user is implemented in the programmable gate array by configuring programmable RAM cells known as a configuration memory. These RAM cells control the logic functionality performed by the CLBs, IOBs, and the interconnect. The loading of the configuration memory is implemented using a set of design software tools as well known in the art.

The perimeter of configurable IOBs provide a programmable interface between the internal logic array and device package pins. The array of CLBs performs user specified logic functions. The interconnection consists of direct connections between specific CLBs or IOBs, and a general connect that is programmed to form networks carrying logic signals among the blocks.

The logic functions performed by the CLBs are determined by programmed lookup tables in the configuration memory. Functional options are performed by program controlled multiplexers. Interconnecting networks between blocks are composed of metal segments joined by programmable interconnect points (PIPs).

The logic functions, functional options, and interconnect networks are activated by a program data which is loaded into an internal distributed array of configuration memory cells. The configuration bit stream is loaded in to the device at power up and can be reloaded on command.

Figure 2:
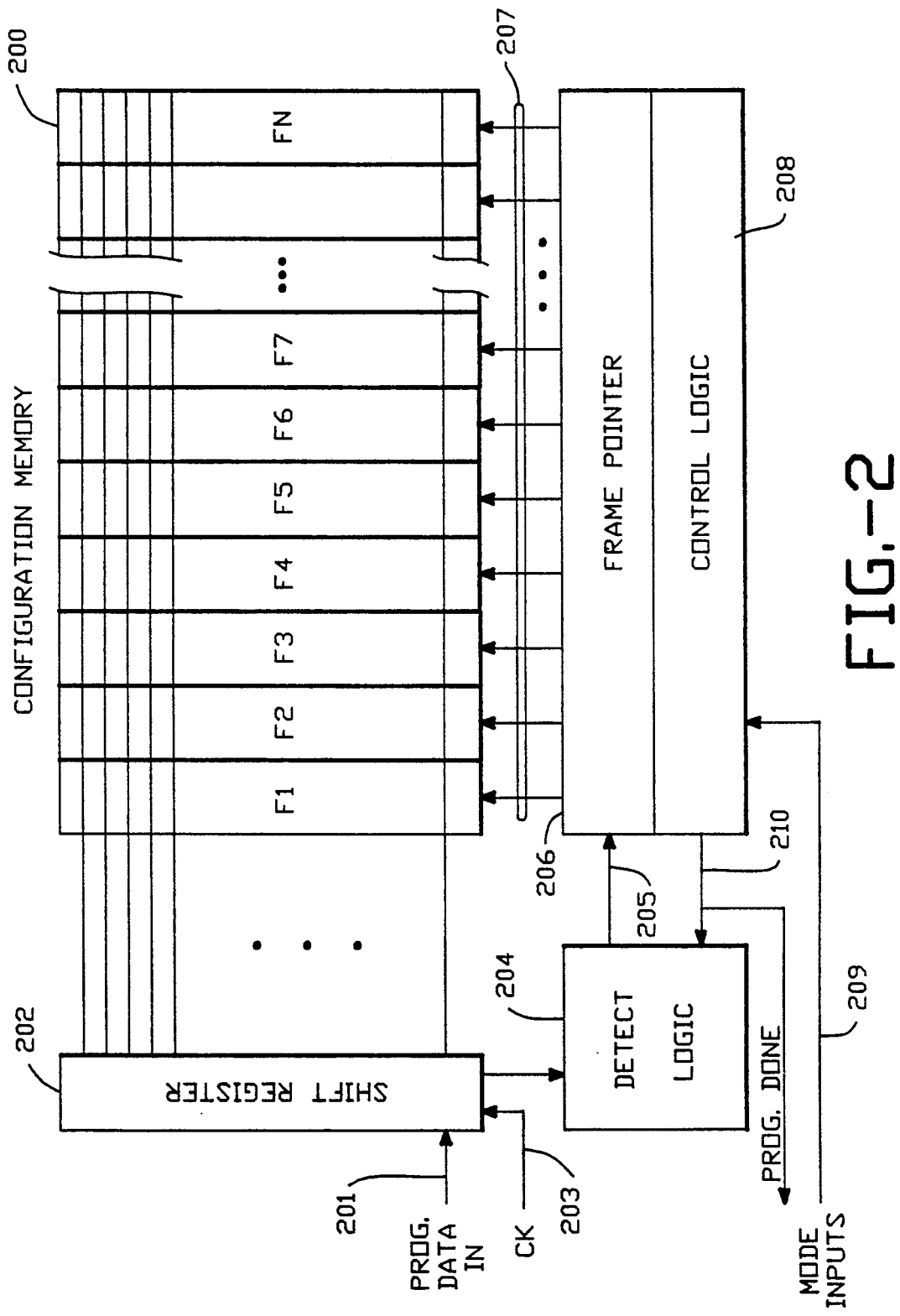
FIG. 2 is a schematic diagram of the configuration memory according to the present invention.

FIG. 2 is a schematic diagram of the configuration memory in the programmable gate array as seen by the program data. The programmable gate array includes a plurality of distributed memory cells referred to as the configuration memory 200. Program data on line 201 is loaded into shift register 202 in response to a clock signal on line 203. Detect logic 204 determines when the shift register is full by reading a preamble from data on 201. When the shift register is full, the detect logic 204 signals across line 205 a frame pointer logic 206 which generates frame pointer signals across lines 207. Control logic 208 is responsive to the mode inputs to the device on line 209 to control the detect logic 204 across line 210 and the frame pointer during loading of the configuration memory 200.

The configuration memory 200 is organized into a plurality of frames F1-FN. As program data is loaded into the shift register, the frame pointer F1 is activated to load the first frame in the configuration memory. When the shift register is loaded with the second frame of data, the frame pointer for F2 is activated, loading the second frame F2, and so on until the entire configuration memory is loaded. Control logic 208 generates a program done signal on line 210.

Figure 3:
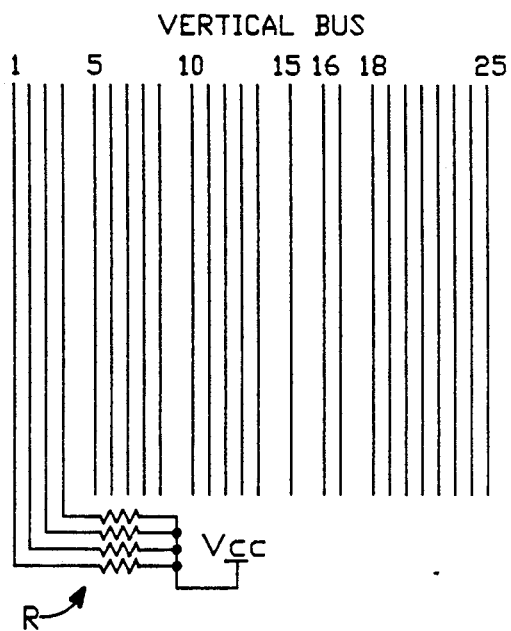
FIG. 3 is a diagram illustrating nomenclature for the vertical bus, and the use of pull up resistors on the long lines of the vertical bus.

FIG. 3 illustrates the notation used for the vertical buses. Each vertical bus has 25 lines. Lines 1-4 and 15-17 are long lines which run across the entire array. Lines 1-4 have pull up resistors R connected to a logic one voltage VCC to establish a normally high state on the long lines. Lines 5-14 consist of bidirectional general interconnect (BGI) segments which are coupled through switching matrices and segment boxes as described below. Lines 18-25 are uncommitted long lines which run the entire length of the array.

Figure 4:
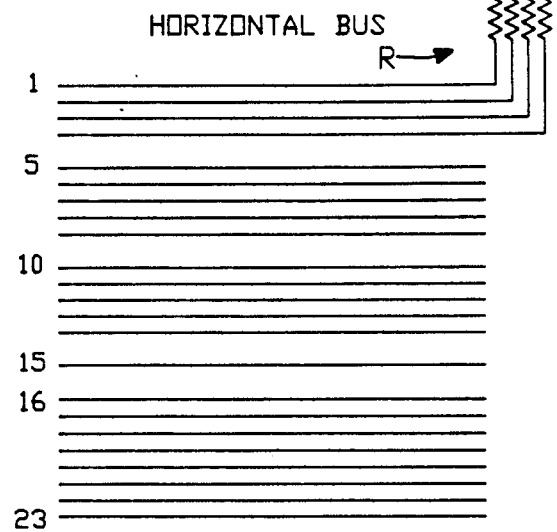
FIG. 4 is a diagram illustrating nomenclature for the horizontal buses and illustrating the pull up resistors used on the long lines of the horizontal buses.

FIG. 4 illustrates the notation used for the horizontal buses. Each horizontal bus is a 23 line bus in which lines 1-4 and 15 are long lines, lines 5-14 are BGI segments, and lines 16-23 are uncommitted long lines. Long lines 1-4 on the horizontal buses also are coupled to pull-up resistors R.

Long lines are characterized by extending across the array, and being coupled through fixed or programmable interconnect points to specific inputs and outputs of the configurable logic cells and input/output cells and to lines on intersecting buses. The BGI segments are characterized by having terminations in segment boxes or switching matrices, rather than extending across the entire array, as well as by being coupled through fixed or programmable interconnect points to specific inputs and outputs of the configurable logic cells and input/output cells. The uncommitted long lines are characterized by extending across the array and by being coupled through programmable interconnect points to specific outputs of configurable logic cells and input/output cells, to BGI segments, and to long lines; and no connections committing the lines to specific inputs of configurable logic cells or input/output cells.

In order to construct networks through a device, the horizontal and vertical buses require means of interconnection. This occurs at the intersections of the horizontal buses and the vertical buses. The interconnections between the lines at the intersection are made through programmable interconnect points, switch matrices, and segment boxes.

More information concerning the interconnect structure can be found in the parent application Ser. No. 07/394,221, which is incorporated by reference.

II. CONFIGURABLE LOGIC BLOCK

A detailed implementation of the configurable logic block is set out with reference to FIGS. 5—25. An overview block diagram is set out in FIG. 5.

Figure 5:
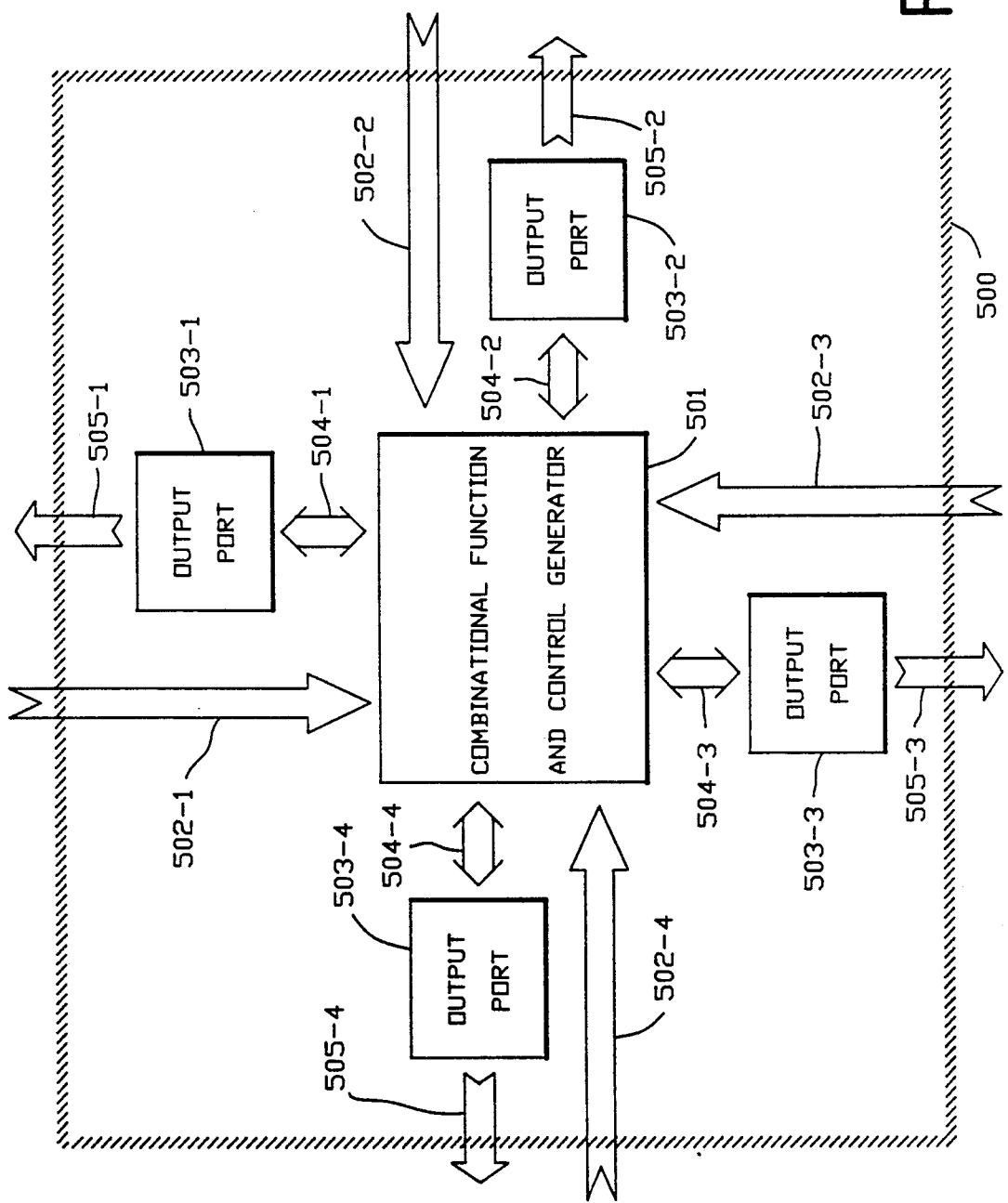
FIG. 5 is a schematic diagram of a configurable logic cell according to the present invention.

The configurable logic block 500 shown in FIG. 5 consists of configurable logic in a combinational function and control generator 501 which receives inputs from four sides, schematically illustrated by buses 502-1, 502-2, 502-3, and 502-4. The combinational function and control generator 501 communicates with four independently configurable output ports (macrocells) 503-1, 503-2, 503-3, and 503-4. The output ports receive signals and supply feedback signals to and from the combinational function and control generator 501 across respective buses 504-1, 504-2 504-3, and 504-4. Each output port supplies at least one output signal, schematically illustrated by the respective output buses 505-1, 505-2, 505-3, and 505-4 to the configurable interconnect structure.

The block diagram of FIG. 5 illustrates at a high level the symmetry of the configurable logic block 500. Input signals can be received from all four sides of the block, likewise, output signals can be supplied to any of the four sides of the block Furthermore, as seen below, input signals from the input bus 502 can be used to generate output signals across bus 505-1, 505-2, 505-3, or 505-4. Similar flexibility is provided from all of the other input buses in the configurable logic block.

Figure 6:
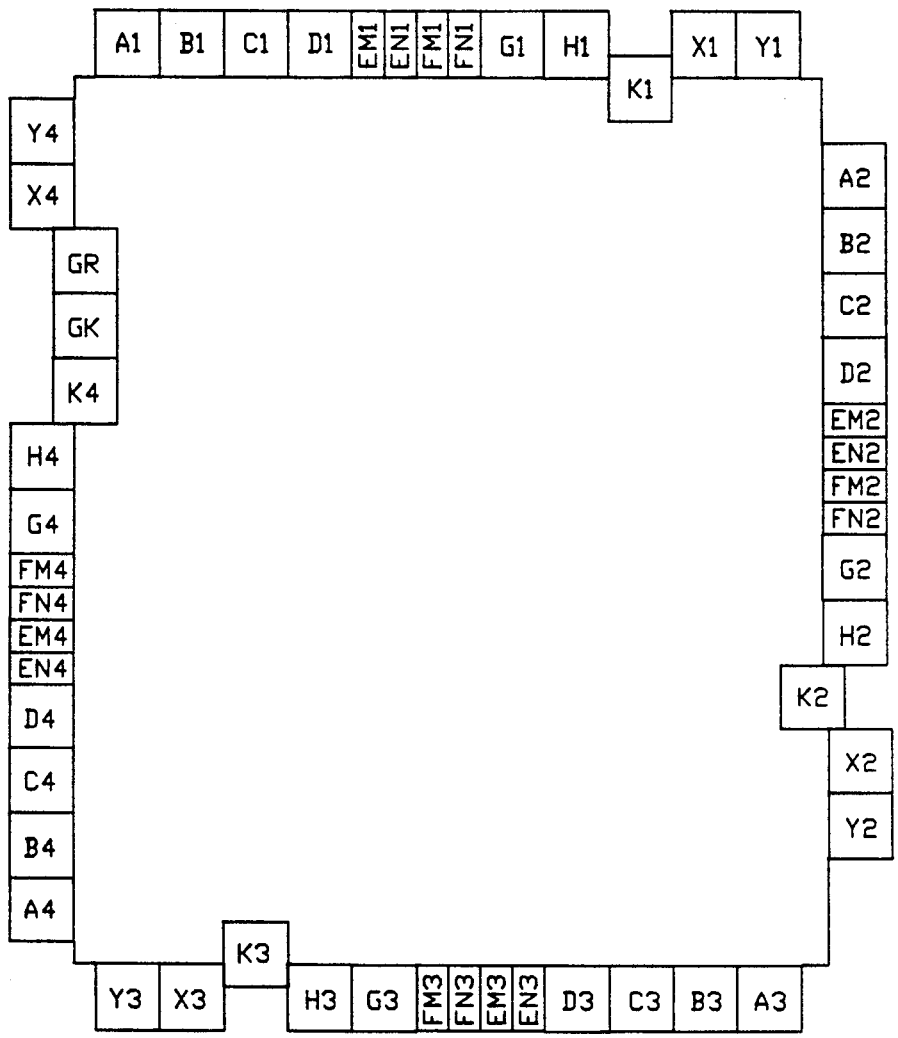
FIG. 6 provides a notation for the inputs and outputs of the configurable logic blocks.

The inputs and outputs to the configurable logic block are set out in FIG. 6. Also, a notation for the inputs and outputs is provided. It can be seen that input signals along the top side of the bus are labeled A1 through D1, EM1, EN1, FM1, FN1, G1, H1, and K1. The outputs are labelled X1 and Y1. Similarly, the suffix 2 is applied to the right side of the chip, the suffix 3 is applied to the bottom of the chip, and the suffix 4 is applied to the left side of the chip. On the left side of the chip, additional inputs GR and GK for global reset and global clock signals are provided.

As shown in the legend in FIG. 6, the inputs A1 through A4 and B1 through B4 are long line inputs. Inputs C1 through C4 and D1 through D4 are inputs coupled to the bidirectional general interconnect segments for logic signals.

The inputs EM1 through EM4, FM1 through FM4, EN1 through EN4, and FN1 through FN4 are direct connect inputs. The inputs G1 through G4 and H1 through H4 are inputs to the bidirectional general interconnect segments for control or logic signals.

The inputs K1 through K4 are long line inputs from bus line 15 used for clock and clock enable functions.

Outputs are supplied at terminals X1 through X4 and Y1 through Y4. The general interconnect structures are coupled to outputs Y1 through Y4. Direct connect structures are connected to X1 through X4, providing direct connection to adjacent and next adjacent configurable logic block in the array. More information concerning the direct connect structure can be found in the parent application, Ser. No. 07/394,221.

Figure 7:
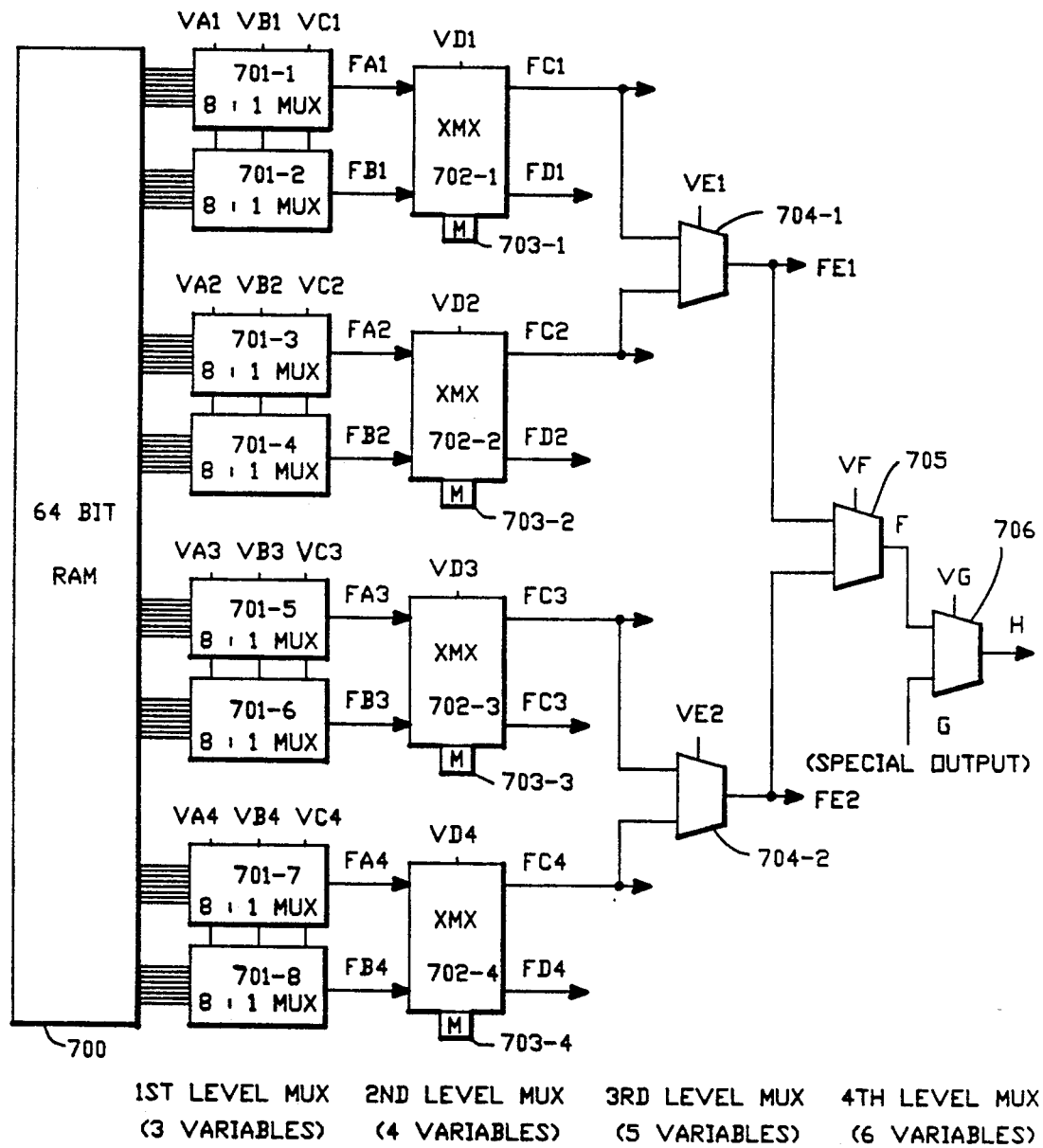
FIG. 7 shows the configurable logic within the configurable logic blocks according to the present invention, with the exception of the special output stage shown in FIG. 8.
Figure 8:
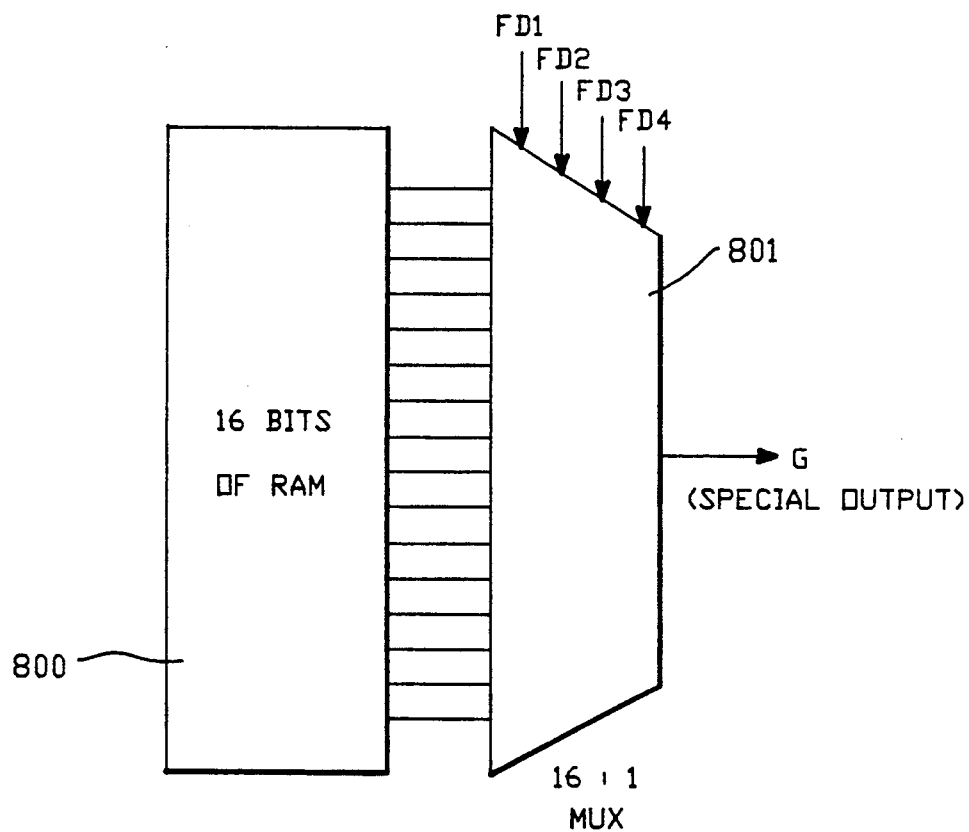
FIG. 8 is a schematic diagram of the special output stage of the logic in the configurable logic block according to the present invention.
Figure 14:
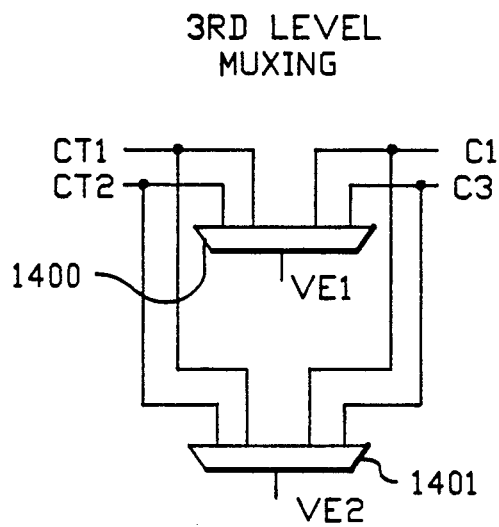
FIGS. 14, 15 and 16 illustrate additional input multiplexing circuits for use within the configurable logic block according to the present invention.
Figure 15:
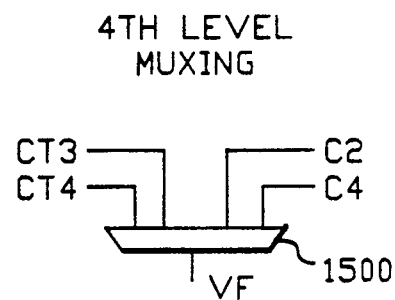
Figure 16:
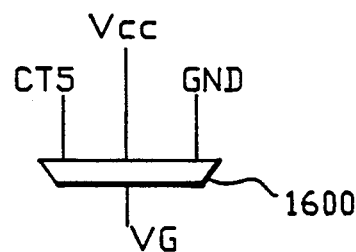

The combinational logic block consists of a 64 bit RAM addressed through a multiplexing tree as shown in FIG. 7, 16 additional bits of RAM addressed through a special output multiplexer as shown in FIG. 8, four independent output macrocells as shown in FIGS. 21-24, and multiplexing structures used for selecting the logic inputs to the multiplexing tree and for control signals shown in FIG. 9-20.

The basic combinational logic function is provided by the multiplexing tree shown in FIG. 7. As stated above, 64 bits of the configuration memory 700 are stored with program data. A first level multiplexing structure divides the 64 bit RAM into eight 8 bit sections. Each 8 bit section is coupled to a 8:1 multiplexer, 701-1 through 701-8. The 8 bit multiplexers are coupled into pairs sharing three common address signals VA1, VB1, VC1 for multiplexers 701-1 and 701-2, signals VA1, VB2, VC2 for multiplexers 701-3 and 701-4, signals VA3, VB3, VC3 for multiplexers 701-5 and 701-6, and finally, signals VA4, VB4, and VC4 for multiplexers 701-7 and 701-8.

Eight independent outputs are generated by the eight 8:1 multiplexers. The outputs FA1 through FA4 are supplied respectively from multiplexers 701-1, 701-3, 701-5 and 701-7. Outputs FB1 through FB4 are supplied respectively from multiplexers 701-2, 701-4, 701-6 and 701-8.

The paired outputs FA1/FB1 are supplied to cross-multiplexer 702-1. FA2/FB2 are supplied to cross-multiplexer 702-2. FA3/FB3 are supplied to cross-multiplexer 702-3. FA4/FB4 are supplied to cross-multiplexer 702-4.

The cross-multiplexers 702-1 through 702-4 are each coupled to a respective memory cell 703-1 through 703-4 in the configuration memory and receive a respective address signal VD1 through VD4.

Cross-multiplexer 702-1 generates outputs FC1 and FD1. Cross-multiplexer 702-2 generates outputs FC2 and FD2. Cross-multiplexer 702-3 generates outputs FC3 and FD3. Cross-multiplexer 702-4 generates outputs FC4 and FD4.

If the memory cell 703-1 associated with cross-multiplexer 701-1 is equal to 0 then the input FA1 is connected to output FC1, and the input FB1 is connected to output FD1. The address signal VD1 coupled to cross-multiplexer 702-1 will have no effect when memory cell 703-1 is 0. Thus, a cross-multiplexer just provides a pass through path for the signals FA1 and FB1, such that the output FC1 and FD1 are two independent variables of the three control signals VA1 through VC1.

When the memory cell 703-1 is set equal to 1, then the address signal VD1 is enabled. If VD1 is 0, then the input FA1 is connected to both outputs VC1 and VD1. If the address signal VD1 is equal to 1, then the input FB1 is connected to both outputs FC1 and FD1. Thus, when the memory cell 703-1 is true, logic signal VD1 acts as a fourth address signal so that the signal on outputs FC1/FD1 is equal to a unique combinational function of the four variables VA1 through VD1.

The function of the cross-multiplexers 702-2 through 702-4 is identical as to that of 702-1 with the exception that the address signals VD2 through VD4 are independently supplied from the input multiplexing structure. Also, each memory cell 703-2 through 703-4 is individually configured during programming.

The output signals FC1 and FC2 are supplied as inputs to third level multiplexer 704-1. Likewise, signals FC3 and FC4 are supplied to third level multiplexer 704-2. Address signals VE1 and VE2 control multiplexers 704-1 and 704-2, respectively. The output FE1 of multiplexer 704-1 and FE2 of 704-2 represent a logic function of five variables.

The signals FE1 and FE2 are supplied as input to a fourth level multiplexer 705. Multiplexer 705 is controlled by address signal VF and generates the output F in response to six variables.

Finally, the signal F is supplied to a special output multiplexer 706. A second input to the multiplexer 706 is the special output signal G. Multiplexer 706 is controlled in response to independent address signal VG and generates the output signal H.

A special output signal G is generated by the special output stage shown in FIG. 8. The special output stage consists of 16 bits of RAM 800 in the configuration memory. The 16 bits are coupled to a 16:1 multiplexer 801. Control inputs to the 16:1 multiplexer include the intermediate logic signals FD1 through FD4 generated by the cross-multiplexers 702-1 through 702-4 in FIG. 7. Because the 16 control signals VA1 through VD1, VA2 through VD2, VA3 through VD3, and VA4 through VD4 can be independently supplied by the input multiplexing structure from outside the CLB, the special output G represents a wide-gating function of 16 variables. Thus, a limited function of 16 variables is available at the G output.

The configurable logic block of the present invention uses 64 bits cascaded with 16 bits to give the ability to decode 64 states of 16 input variables.

Figure 9:
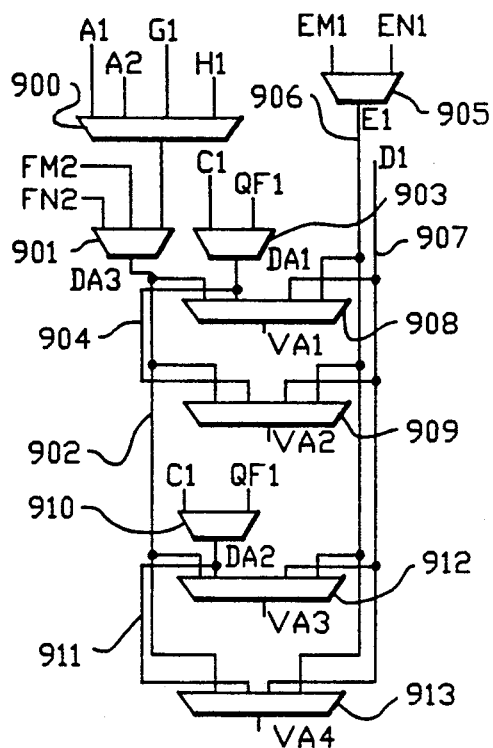
FIGS. 9-12 illustrate input multiplexing circuits for the configurable logic block according to the present invention.

The input multiplexing for the configurable logic block for generation of the address signals VA1 through VA4 is shown in FIG. 9. The structure includes the first 4:1 multiplexer 900 receiving the signals A1, A2, G1, and H1 as inputs. The output of multiplexer 900 is supplied as an input to 3:1 multiplexer 901. Two additional inputs to multiplexer 901 include FM2 and FN2. The output of multiplexer 901 is the signal DA3 on line 902. Other inputs to the multiplexing tree include the signals C1 and QF1 supplied to the 2:1 multiplexer 903. The output of the 2:1 multiplexer 903 is the signal DA1 on line 904. The inputs C1 and QF1 are also supplied to a second input multiplexer 910 which supplies the output DA2 on line 911.

Also, the input signals EM1 and EN1 are supplied to 2:1 multiplexer 905. The output E1 is supplied on line 906. The input D1 is coupled to line 907.

The address signal VA1 is supplied at the output of 4:1 multiplexer 908. The four inputs to multiplexer 908 include the signals D1, E1, DA1, and DA3.

The address signal VA2 is supplied at the output of multiplexer 909. The inputs to multiplexer 909 include the signals D1, E1, DA1 and DA3.

The address signal VA3 is supplied at the output of multiplexer 912. The inputs to multiplexer 912 include D1, E1, DA2 and DA3.

Finally, the address signal VA4 is supplied at the output of 4:1 multiplexer 913. The inputs to multiplexer 913 include D1, E1, DA2 and DA3. All of the multiplexers shown in FIG. 9 are controlled by memory cells in the configuration memory.

Figure 10:
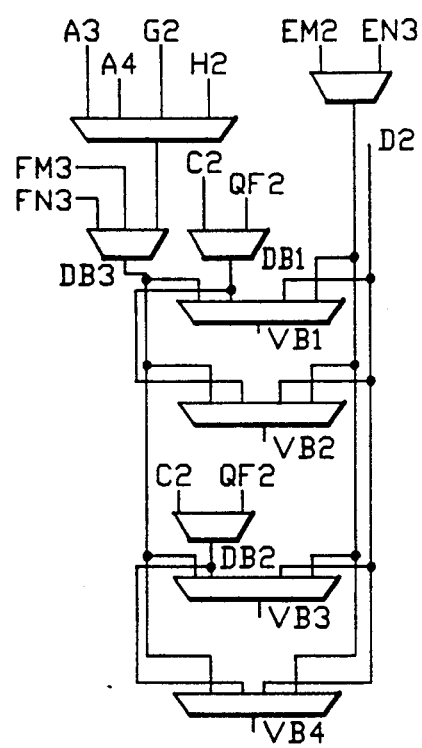

The address signals VB1 through VB4 are generated in multiplexing tree of FIG. 10 which is identical to the MUX tree of FIG. 9, except that the inputs are different. Thus, the connection of the multiplexing tree is not repeated here. Rather, only the inputs are recited. The inputs to the multiplexing tree include FN3, FM3, A3, A4, G2, H2, C2, QF2, EM2, EN2, and D2. Accordingly, any one of the address signals generated by the multiplexing tree in FIG. 10 is selected from one of eleven inputs.

Figure 11:
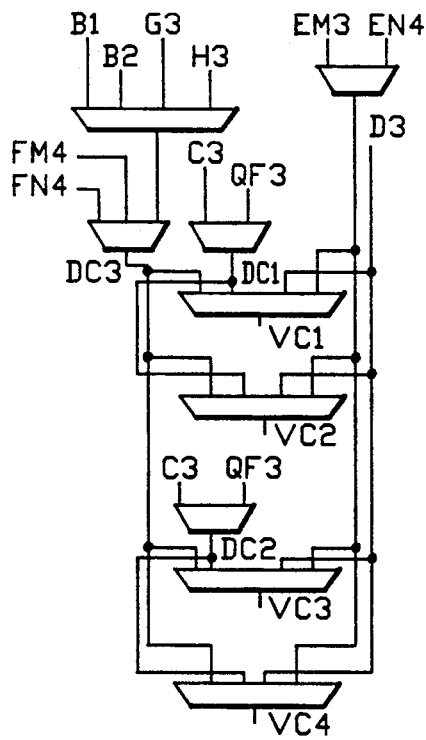
Figure 12:
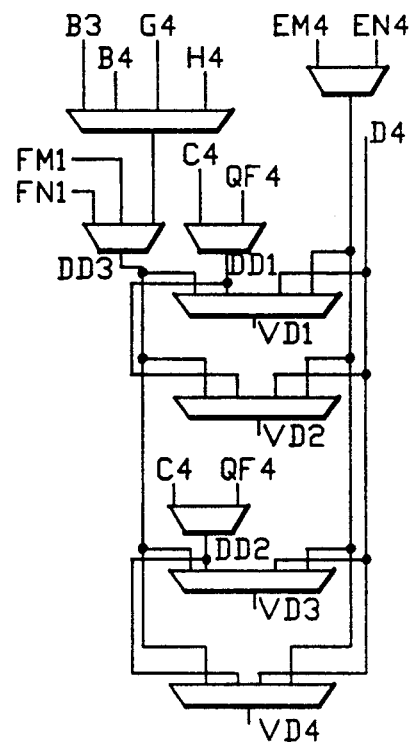

Similarly, FIGS. 11 and 12 show respectively the multiplexing trees generating the address signals VC1 through VC4, and VD1 through VD4. The inputs to the multiplexing tree in FIG. 11 include FN4, FM4, B1, B2, G3, H3, C3, QF3, EM3, EN3 and D3.

The inputs to the multiplexing tree of FIG. 12 include FN1, FM1, B3, B4, G3, H3, C4, QF4, EM4, EN4 and D4.

The QF1-QF4 signals supplied as input to the multiplexing trees of FIGS. 9-12 are feedback from the output macrocells described in FIGS. 21-24.

It can be seen from review of FIGS. 9-12 that the address signals VA1 through VA4, VB1 through VB4, VC1 through VC4, VD1 through VD4, are generated using an input multiplexing tree which does not require sharing of input variables. Furthermore, each of the 16 address signals of FIGS. 9-12 can be derived from independent sources. Furthermore, the inputs are derived from all four sides of the configurable logic block allowing for symmetrical implementation of a network on the array. Of course, the specific implementation of the multiplexing trees of FIGS. 9-12 can be modified as suits the needs of a particular application. For instance, to equalize the signal delays, one could modify the multiplexing trees to provide that all inputs go through the same numbers and style of multiplexers.

Figure 13A:
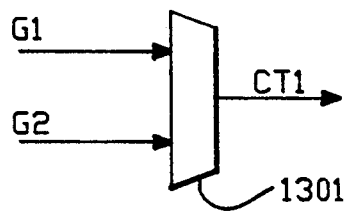
FIGS. 13A-13H are input multiplexers for selecting control signals within the configurable logic blocks.

FIGS. 13A-13H illustrate generation of the internal control signals CT1 through CT8, respectively. FIG. 13A illustrates generation of the signal CT1 in response to the inputs G1 and G2 through multiplexer 1301.

Figure 13B:
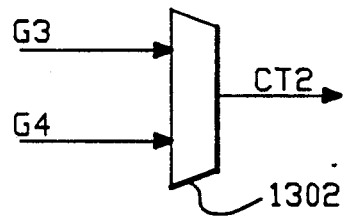

FIG. 13B illustrates generation of the signal CT2 through multiplexer 1302 in response to inputs G3 and G4.

Figure 13C:
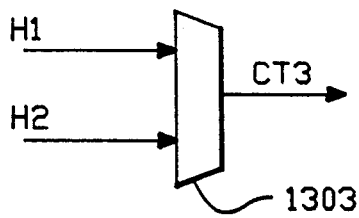

FIG. 13C illustrates generation of the signal CT3 through multiplexer 1303 in response to inputs H1 and H2.

Figure 13D:
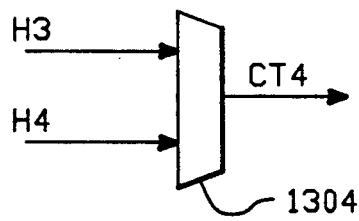

FIG. 13D illustrates generation of the signal CT4 through multiplexer 1304 in response to inputs H3 and H4.

Figure 13E:
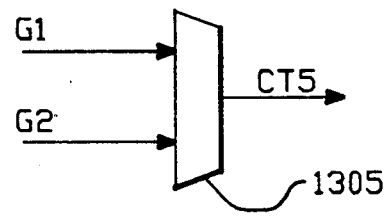

FIG. 13E illustrates generation of the signal CT5 by multiplexer 1305 in response to inputs G1 and G2.

Figure 13F:
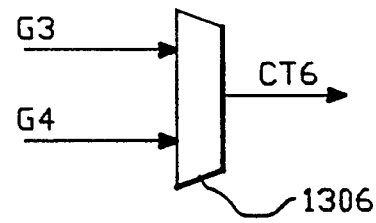

FIG. 13F illustrates generation of the signal CT6 by multiplexer 1306 in response to inputs G3 and G4.

Figure 13G:
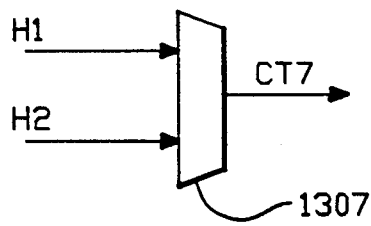

FIG. 13G illustrates generation of the signal CT7 by multiplexer 1307 in response to inputs H1 and H2.

Figure 13H:
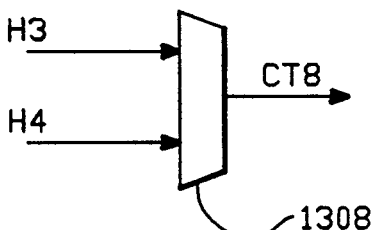

FIG. 13H illustrates generation of the signal CT8 by multiplexer 1308 in response to inputs H3 and H4.

FIGS. 13A-13H are generated using 2:1 muxes. Other designs may use, for example, 4:1 muxes for greater flexibility in selecting signal sources.

In FIG. 14, the MUX tree generates the address signals VE1 and VE2 in response to the control signals CT1 and CT2 and to the input signals C1 and C3. VE1 is generated at the output of multiplexer 1400 which receives all four of the input variables CT1, CT2, C1, C3 as inputs. The signal VE2 is generated the output of 4:1 multiplexer 1401 which receives CT2, CT1, C1 and C3 as inputs.

The signal VF is generated at the output of multiplexer 1500 shown in FIG. 15. Multiplexer 1500 is a 4:1 multiplexer receiving the inputs CT3, CT4, C2 and C4.

The signal VG is generated at the output of the 3:1 multiplexer 1600 shown in FIG. 16, receiving the input signals CT5, $V_{CC}$ and GROUND.

Again the choice of inputs used to generate the signals VE1, VE2, VF and VG can be adapted to provide other combinations for different or different numbers of inputs as suits the needs of a particular design.

Figure 17:
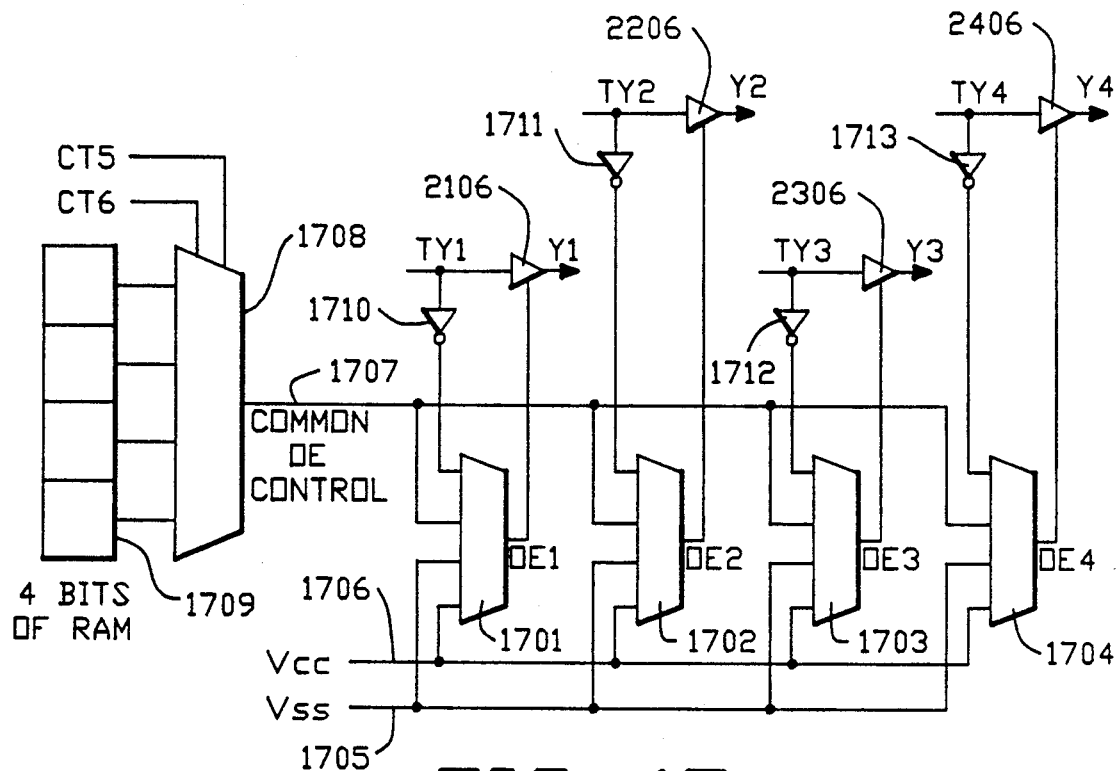
FIG. 17 illustrates generation of output enable signals within the configurable logic block.

FIG. 17 illustrates the circuit for generating the output enable signals 0E1 through 0E4 for the macrocells of FIGS. 21-24. In FIG. 17, the tristatable output buffers 2106, 2206, 2306 and 2406, generating the outputs Y1 through Y4, respectively, of the macrocells shown in FIGS. 21-24, respectively, are illustrated.

The circuit generating the output enable signals is based on a plurality of selectors, 1701, 1702, 1703 and 1704, which supply, at their respective outputs, the signals 0E1, 0E2, 0E3 and 0E4 to the tristatable output buffers. Each of the selectors, 1701, 1702, 1703, 1704, includes a plurality of inputs and supplies a signal from one of the plurality of inputs to its output in response to program data in the configuration memory. (not shown).

The inputs to the selectors include a first signal on line 1705 supplying a logic low level and a second signal on line 1706 supplying a logic high level. Also, each of the selectors 1701-1704 is connected to a common OE control line 1707. The signal on the common OE control line is supplied at the output of selector 1708 which is controlled in response to control signal CT5 and CT8 which are generated in the configurable logic cell in response to inputs from the configurable interconnect and to the program data in the configuration memory. The inputs to the selector 1708 are 4 bits of RAM 1709 of the configuration memory.

The fourth input to each of the plurality of selectors 1701-1704 is supplied to enable the tristatable buffer to operate as a connection to a wired-AND line. This fourth input for selector 1701 is supplied at the output of invertor 1710. The input of invertor 1710 is connected to receive the signal TY1, which is also supplied as input to the tristatable output buffer 2106.

The fourth input to selector 1702 is supplied at the output of invertor 1711, which receives as input the signal TY2, which is also connected as input to the tristatable buffer 2206.

The fourth input of the selector 1703 is supplied at the output of invertor 1712 which receives as input the signal TY3 which is also connected as input to the tristatable buffer 2306.

The fourth input to selector 1704 is supplied at the output of invertor 1713 which receives as input the signal TY4 which is also connected as input to the tristatable buffer 2406.

The circuit supplying the output enable signals, shown in FIG. 17, provides the ability to individually configure the output macrocells in each configurable logic cell in the array. Each of the cells, in response to the program data controlling the respective selectors, can operate in one of four states. In the first state, the tristate buffer is permanently enabled. In the second state, the tristate buffer is permanently tristated. In the third state, the tristate buffer is dynamically controlled in response to the common OE control signal on line 1707. In the fourth state, the tristate buffer operates for coupling the signal TY1 to the configurable interconnect in a wired-AND configuration.

Figures 18, 19:
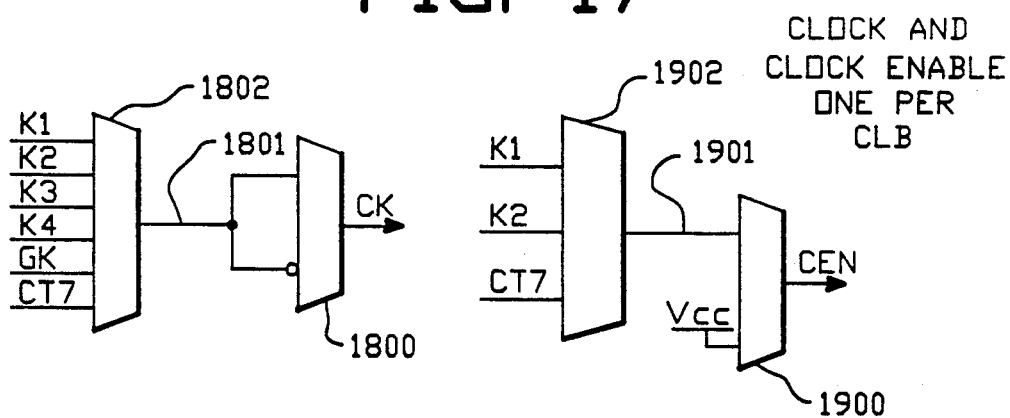
FIGS. 18-20 illustrate generation of the clock, clock enable and reset signals within the configurable logic block.

FIG. 18 illustrates generation of the clock signal CK which is used to clock the registers in the output macrocells. This signal is generated at the output of 2:1 multiplexer 1800. The inputs to the 2:1 multiplexer 1800 include a true and complement version of the signal supplied on line 1801 at the output of 6:1 multiplexer 1802.

Multiplexer 1802 receives as inputs the signals K1 through K4 from bus line 15 on four sides of the configurable logic block, the input GK from the global clock lines, and the control signal CT7. The multiplexers in FIG. 18 are configured by memory cells in the configuration memory.

FIG. 19 illustrates generation of the clock enable signal CEN which is coupled to the registers in the output macrocells. The clock enable signal is generated at the output of multiplexer 1900. The input to multiplexer 1900 includes a signal on line 1901 which is supplied at the output of the 3:1 multiplexer 1902. The second input to multiplexer 1900 is the $V_{CC}$ signal. Thus, the clock enable signal can be permanently asserted by connection to $V_{CC}$. The inputs to multiplexer 1902 include the K1 signal, K2 signal and the control signal CT7. Of course, the combination of sources for CEN can be changed or expanded.

Figure 20:
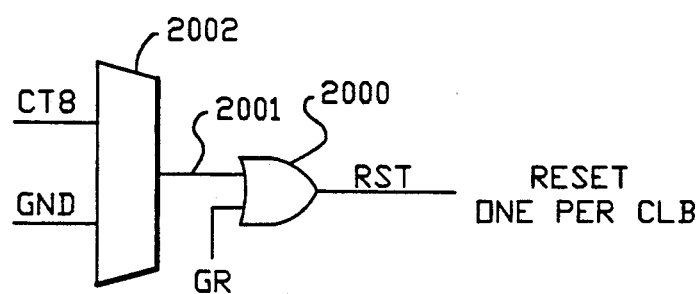

FIG. 20 illustrates generation of the reset signal RST which is supplied to the registers in the output macrocells in the configurable logic block. The reset signal is generated at the output of OR-gate 2000. The inputs to OR-gate 2000 include the signal on line 2001 which is generated at the output of multiplexer 2002. The other input to OR-gate 2000 is the global reset signal GR. The two inputs to multiplexer 2002 include CT8 and GROUND. Thus, the reset signal RST can be permanently inhibited by connection to GROUND. Global reset GR is always allowed.

Thus, the configurable logic block described above provides input interfaces on all four sides of the block to the interconnect structure. Furthermore, it allows for wide gating and narrow gating functions without suffering a speed penalty for the narrow gated functions.

The circuits of FIGS. 18-20 could be modified as the output enable circuit of FIG. 17, to provide individual control of the clock, clock enable, and reset for the output macrocells.

The output macrocells for the configurable logic block are shown in FIGS. 21-24.

Figure 21:
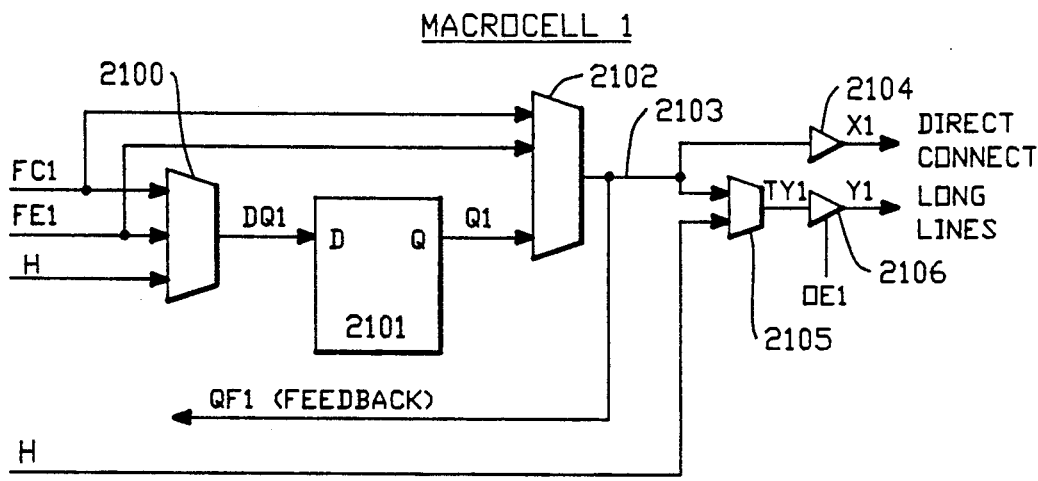
FIGS. 21-24 illustrate the output macrocells within the configurable logic block.

The macrocell in FIG. 21 selects signals for supply to outputs X1 and Y1 of the configurable logic block. Inputs to the macrocell include FC1, FE1, and H generated within the CLB. The inputs FC1, FE1 and H are coupled to multiplexer 2100. The output DQ1 of multiplexer 2100 is supplied as a D input to register 2101. The output Q1 of register 2101 is coupled as an input to multiplexer 2102. Two additional inputs to multiplexer 2102 include FC1 and FE1. The output of multiplexer 2102 is coupled to line 2103. Line 2103 supplies the signal QF1 as feedback to the combinational logic (see, FIG. 9). Likewise, it is coupled directly to an output buffer 2104 for driving the output signal X1 for the direct connect.

Signal 2103 is also coupled to multiplexer 2105. The second input to multiplexer 2105 is the signal H. The output TY1 of multiplexer 2105 is coupled to a tristate output buffer 2106. The output of buffer 2106 is the Y1 signal for connection to the interconnect structure. The tristate buffer 2106 is controlled by the control signal OE1 generated within the configurable logic block as described with reference to FIG. 17.

Figure 22:
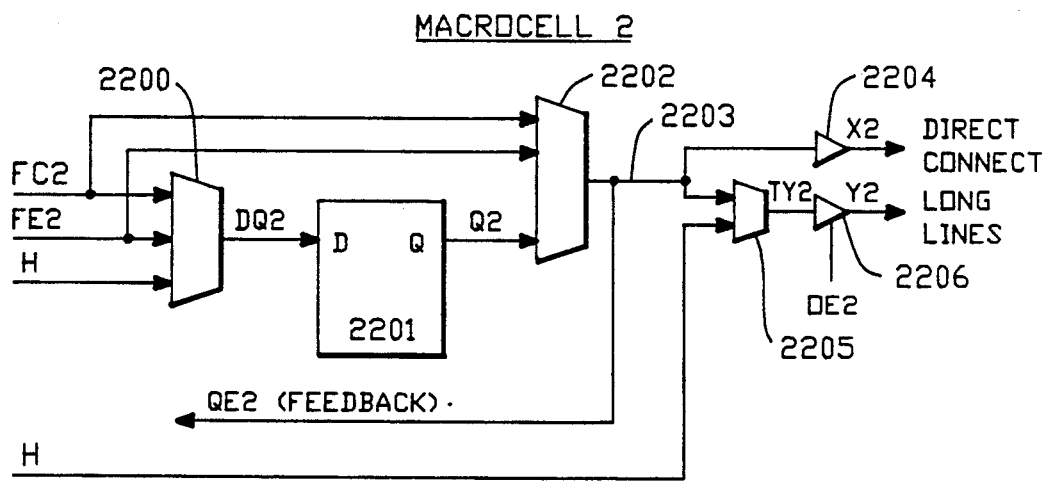

FIG. 22 shows the macrocell supplying signals to the outputs X2 and Y2. The inputs to macrocell 2 in FIG. 22 include FC2, FE2, and H generated within the CLB. FC2, FE2, and H are supplied through multiplexer 2200 to generate the signal DQ2. DQ2 is supplied to register 2201. The output Q2 of register 2201 is supplied as an input to multiplexer 2202. Other inputs to multiplexer 2202 include FC2 and FE2. The output QF2 of multiplexer 2202 is supplied on line 2203 as feedback and directly to output buffer 2204 supplying the signal X2 to the direct connect.

The signal on line 2203 is also supplied to multiplexer 2205. The second input to multiplexer 2205 is the signal H. The output TY2 of multiplexer 2205 is supplied as an input to tristate output buffer 2206, which drives the signal Y2. Tristate buffer 2206 is controlled by control signal OE2.

Figure 23:
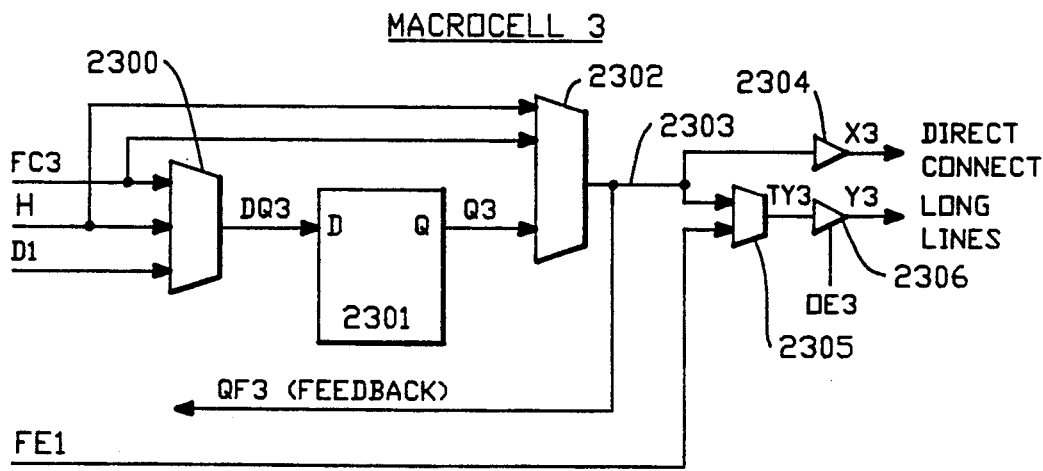

The output macrocell of FIG. 23 drives signals to outputs X3 and Y3. Its inputs include the signals FC3, FE1, D1 and H generated within the CLB. The inputs FC3, H and D1 are coupled through multiplexer 2300 to supply the signal DQ3. Signal DQ3 is coupled to register 2301. The output Q3 of register 2301 is supplied as an input to multiplexer 2302. Two other inputs to multiplexer 2302 include FC3 and H. The output QF3 of multiplexer 2302 is supplied on line 2303 as feedback and directly to the buffer 2304 which drives the signal X3. Also, the signal on line 2303 is supplied to multiplexer 2305. The second input to multiplexer 2305 is signal FE1. The output TY3 of multiplexer 2305 is supplied to the tristate buffer 2306 driving the signal Y3. The tristate buffer 2306 is controlled by the signal OE3.

Figure 24:
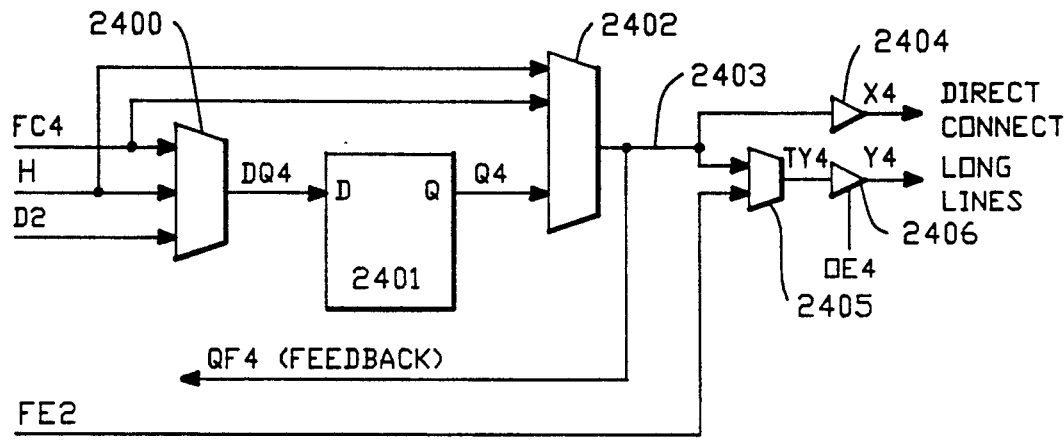

The output macrocell for the driving signals to outputs X4 and Y4 is shown in FIG. 24. It is similar to the macrocell of FIG. 23. The input signals include FC4, FE2, D2 and H generated within the CLB. The signals FC4, H and D2 are supplied through multiplexer 2400 to supply the signal DQ4. Signal DQ4 is supplied through register 2401 to generate the output signal Q4. The output signal Q4 is supplied to multiplexer 2402. Other inputs to multiplexer 2402 include FC4 and H. The output of multiplexer 2402 is the signal QF4 on line 2403 which is supplied as feedback and is coupled to buffer 2404 to drive the signal X4. The signal on line 2403 is also supplied to multiplexer 2405. A second input to multiplexer 2405 is the signal FE2. Multiplexer 2405 generates a signal YT4 which is coupled to the tristate buffer 2406. Tristate buffer 2406 is controlled by the signal OE4 and drives the output Y4 of the configurable cell Note that the macrocells of FIGS. 23 and 24 provide for utilization of the registers 2301 and 2401 even if they are not used for driving the output of the combinational logic. This is provided by allowing the inputs D1 and D2 of the CLB to be directly coupled to the registers in the output macrocells.

Figure 25:
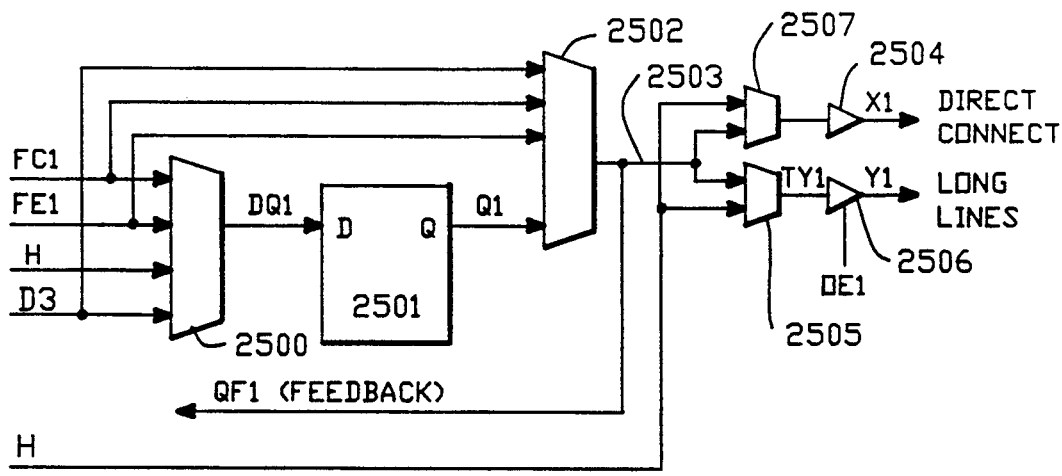
FIG. 25 illustrates an alternative output macrocell design for use within the configurable logic block.

An alternative macrocell is shown in FIG. 25. The illustrated macrocell selects signals for supply to outputs X1 and Y1 of the configurable logic block. However, it can be used for all four output macrocells as a symmetrical interface for the signals D1-D4 and for supplying the fast output path for the signal H to both the direct output X and tristate output Y.

The inputs to the alternative macrocell of FIG. 25 for outputs X1 and Y1 include FC1, FE1, H and D3. To adapt the macrocell to outputs X2 and Y2, the inputs would be changed to FC2, FE2, H and D4. To adapt the macrocell to outputs X3 and Y3, the inputs would be changed to FC3, FE1, H and D1. To adapt the macrocell to outputs X4 and Y4, the inputs would be changed to FC4, FE2, H and D2.

The connections of FIG. 25 are representative. For this circuit, the inputs FC1, FE1, D3 and H are coupled to multiplexer 2500. The output DQ1 of multiplexer 2500 is supplied as a D input to register 2501. The output Q1 of register 2501 is coupled as an input to multiplexer 2502. Three additional inputs to multiplexer 2502 include D3, FC1 and FE1. The output of multiplexer 2502 is coupled to line 2503. Line 2503 supplies the signal QF1 as feedback to the combinational logic (see, FIG. 9). Likewise, it is supplied as one input to multiplexer 2507. The second input to multiplexer 2507 is the signal H. The output of multiplexer 2507 is connected to an output buffer 2504 for driving the output signal X1 for the direct connect.

Signal 2503 is also coupled to multiplexer 2505. The second input to multiplexer 2505 is the signal H. The output TY1 of multiplexer 2505 is coupled to a tristate output buffer 2506. The output of buffer 2506 is the Y1 signal for connection to the interconnect structure. The tristate buffer 2506 is controlled by the control signal OE1 generated within the configurable logic block as described with reference to FIG. 17.

Although not shown in FIGS. 21-25, each register includes a clock, clock enable and reset control. Furthermore, each of the multiplexers shown in the figures, unless a dynamic control signal is explicitly shown, is controlled by memory cells in the configuration program. Thus, the configuration of the macrocells is set during programming of the device.

Note also that the macrocell allows the output X1 and the output Y1 to be driven from different sources at the same time. This gives the configurable logic block the ability to produce up to eight outputs at a time.

The Y1 through Y4 signals are each applied to drive bus lines in the interconnect through PIPs. The outputs X1 through X4 provide a high speed signal path to adjacent and next adjacent configurable logic cells or input/output cells in the array.

III. PROGRAMMABLE CONNECTIONS TO THE INTERCONNECT

FIG. 26 shows the programmable connections of the outputs Y1 through Y4 to the long lines and BGI. The outputs Y1 through Y4 are also connected to the uncommitted long lines as shown in FIG. 28. Also, the outputs are coupled differently to the vertical bus 1 and horizontal bus 1, vertical bus 9 and horizontal bus 9 as shown in the parent application, Ser. No. 07/394,221 as it relates to the long lines 1–4 in the respective buses.

FIG. 26 shows that the output Y1 is coupled to PIPs associated with logic long lines 1, 2, 3, and 4, and control long line 15, and BGIs 5, 9, 13, and 14 in HBUS r. The output Y2 of CLB in column c, row r is coupled to VBUS c+1 long lines 1, 2, 3, and 4 and control long line 15, and BGIs 5, 7, 11, and 14. Output Y3 of the CLB is coupled to HBUS r+1 long lines 1, 2, 3, and 4, and control long line 15, and to BGI lines 5, 8, 12, and 14. The output Y4 of the CLB is coupled to VBUS c long lines 1, 2, 3, and 4, and control long line 15, and to BGI 5, 6, 10, and 14.

Also shown in FIG. 26 are the inputs to C1 through C4 and D1 through D4. These inputs are coupled as the unidirectional PIPs using four to one multiplexers in the preferred system to save on memory. One could use bidirectional PIPs, if desired.

The input C1 is coupled to BGI 7, 9, 11, and 13 on HBUS r. Input D1 is coupled to BGI 6, 8, 10, and 12 on HBUS r.

Input C2 is coupled to BGI of VBUS c+1 lines 6, 8, 10, and 12, while input D2 is coupled to VBUS c+1 BGI 7, 9, 11, and 13.

The input C3 is coupled to HBUS r+1 BGI 6, 8, D3 10, and 12. Input D3 is coupled to HBUS r+1 BGI 7, 9, 11, and 13.

The input C4 is coupled to VBUS c BGI 7, 9, 11, and 13. The input D4 is coupled to VBUS c BGI 6, 8, 10, and 12.

FIG. 27 shows the programmable inputs from the long lines and fixed inputs from the BGI to the CLB of column c, row r, from the four adjacent buses.

For HBUS r, long lines 2 and 4 are coupled through PIPs to input A1, long lines and 3 are coupled through PIPs to input B1, BGI 5 is coupled to input G1, BGI 14 is coupled to input H1, and clock long line 15 is coupled to input K1.

For VBUS c+1, long lines and 3 are coupled through PIPs to input A2, long lines 2 and 4 are coupled through PIPs to input B2, BGI 5 is coupled to input G2, BGI 14 is coupled to input H2, and clock long line 15 is coupled to input K2.

For HBUS r+1, long lines 1 and 3 are coupled through PIPs to input A3, long lines 2 and 4 are coupled to input B3, BGI 5 is coupled to input G3, BGI 14 is coupled to input H3, and clock long line 15 is coupled to input K3.

For VBUS c, long lines 2 and 4 are coupled through PIPs to input A4, long lines and 3 are coupled through PIPs to input B4, BGI 5 is coupled to input G4, BGI 14 is coupled to input H4, clock long line 15 is coupled to input K4, global clock long line 16 is coupled to input GK, and global reset long line 17 is coupled to input GR.

The connection of the configurable logic blocks to the uncommitted long lines is shown in FIG. 28. Each CLB, such as the CLB at row r and column c, has outputs Y1 through Y4 coupled to all eight uncommitted long lines through PIPs. In FIG. 28, only lines 18-25 of the vertical buses, and lines 16-23 of the horizontal buses are shown, because these are the uncommitted long lines. Note that the uncommitted long lines do not have programmable connections to inputs of CLBs.

Each configurable logic block as shown in FIGS. 26 and 27 has inputs labeled K1, K2, K3 and K4. The input K1 is connected to line 15 in the horizontal bus above the block. Input K2 is directly connected to line 15 in the vertical bus to the right of the block. Input K3 is directly connected to line 15 in the horizontal bus below the block. Input K4 is directly connected to the vertical bus to the left of the block. Likewise, each configurable logic block has output Y1, Y2, Y3 and Y4. The output Y1 is connectable through a PIP to line 15 in the horizontal bus above the block. Output Y2 is connectable through a PIP to line 15 in the vertical bus to the right of the block. Output Y3 is connectable through a PIP to line 15 in the horizontal bus below the block. Output Y4 is connectable through a PIP to line 15 in the vertical bus to the left of the block.

IV. CONCLUSION

The present invention can be characterized as a new architecture for a programmable gate array device which provides more powerful connection options between the configurable logic blocks and interconnect structures.

Overall, the architecture overcomes many of the problems of the prior art. The signal propagation is no longer constrained from left to right by the interconnect structure or the input and output orientation of the CLBs.

Furthermore, the architecture eliminates the need for tristate buffers distributed through the device that must be incorporated into a net. This is accomplished by moving the tristate buffers inside the IOBs and CLBs. Thus, for applications requiring multi-source nets, interconnect resources are not used up.

The configurable logic blocks according to the present invention eliminate the sharing of input variables in wide gating functions, provide the ability to perform wide gating functions without speed penalty for the narrow gating functions, and allow much greater utilization of the combinational logic available in the CLB because of the input multiplexing structure. Furthermore, the CLBs are symmetrical in that they allow inputs and outputs from all four sides of the block, and are capable of receiving control signals and clock signals from all four sides.

Furthermore, because of the flexibility in the input and output structure of the CLB, under-utilized CLBs do not suffer a speed penalty.

The present invention thus allows implementation of programmable gate arrays that are adaptable to a wider variety of applications than the prior art. Further, these implementations allow manufacture of a programmable gate array with greater functional density that can be efficiently utilized at a greater percentage capacity than available in prior art architectures for PGAs.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A configurable logic array comprising:
   a substrate; and
   a plurality of logic areas defined on the substrate, each logic area having a perimeter and programmable logic circuitry positioned within the perimeter for performing logic operations therein in accordance with user-provided configuration data;
   wherein each logic area is symmetrically divisible into at least first through fourth logic area portions;
   wherein each logic area includes five or more input terminals distributively positioned about the perimeter of the logic area for receiving five or more input signals supplied from outside the perimeter and for conducting the five or more externally supplied input signals into the logic area;
   wherein the programmable logic circuitry of each logic area includes combinatorial logic means, operatively coupled to the five or more input terminals of the logic area, for producing a plurality of combinatorial logic signals, each combinatorial logic signal being a function of one or more of the externally supplied input signals, at least one of the combinatorial logic signals being a variable-rich logic signal which is a function of at least five of the externally supplied input signals;
   wherein each logic area further includes four output macrocells, operatively coupled to the corresponding combinatorial logic means of the logic area and positioned for distributively outputting the combinatorial logic signals produced by the corresponding combinatorial logic means out of the logic area respectively from the first through fourth area portions of the logic area; and
   wherein each of the four output macrocells includes a rich-signal output means for outputting said at least one variable-rich logic signal equally out from the respective one of the first through fourth logic area portions corresponding to that macrocell.

2. A configurable logic array according to claim 1 wherein each logic area includes at least one signal-storing register and each of the four output macrocells further includes a registered rich-signal output means for outputting a registered version of said at least one variable-rich logic signal equally out from the respective one of the first through fourth logic area portions corresponding to that macrocell, said registered version of the at least one variable-rich logic signal being supplied from the at least one signal-storing register of the logic area.

3. A configurable logic array according to claim 2 wherein each logic area includes first through fourth signal-storing registers, each respectively belonging to one of the four output macrocells and each coupled to receive the at least one variable-rich logic signal equally from the corresponding logic means of the logic area; and wherein the registered rich-signal output means of each of the four output macrocells receives a registered version of said at least one variable-rich logic signal from a respective one of the first through fourth signal-storing registers.

4. A configurable logic array according to claim 1 further comprising a configurable interconnect network defined on the substrate, wherein the plural logic areas are spaced apart from one another and interconnected by the configurable interconnect network.

5. A configurable logic array according to claim 4 wherein four or more of the input terminals in each logic area are symmetrically distributed about the perimeter of the logic area and the configurable interconnect network includes corresponding sets of interconnect buses symmetrically disposed about each logic area for supplying input signals to the input terminals of the logic areas.

6. A configurable logic arrays according to claim 1 wherein four or more of the input terminals in each logic area are symmetrically distributed about the perimeter of the logic area.

7. A configurable logic array according to claim 1 wherein there are sixteen input terminals distributively positioned about the perimeter of each logic area for receiving sixteen input signals supplied from outside the perimeter and for conducting the sixteen externally supplied input signals into the logic area; and
    the variable-rich signal of each logic area is a function of the sixteen externally supplied input signals.

8. A configurable logic array according to claim 1 further comprising a configurable interconnect network defined on the substrate, the interconnect network including at least four tri-state lines running adjacent to the at least first through fourth logic area portions of each of the logic areas; and
    wherein each of the four macrocells in each logic area includes a tri-state buffer for outputting the combinatorial logic signals produced by corresponding combinatorial logic means out of the logic area and onto a corresponding tri-state line adjacent to its corresponding logic area portion.

9. A configurable logic array comprising:
a substrate;
a configuration memory defined on the substrate;
a plurality of pads defined on the substrate, the pads being provided for conducting signals flowing between points on the substrate and points off the substrate;
a plurality of logic areas defined on the substrate, each logic area having a perimeter and top, bottom left and right portions within the perimeter, each logic area further having:
    five or more input terminals positioned about its perimeter for distributively supplying five or more input signals received from outside the perimeter into the top, bottom, left and right portions, of the logic area;
    a combinatorial logic circuit, positioned within the perimeter and operatively coupled to the five or more input terminals, for producing a plurality of combinatorial logic signals, each combinatorial logic signal being a combinatorial function of one or more of the supplied input signals, at least one of the combinatorial logic signals being a variable-rich logic signal which is a function of at least five of the supplied input signals; and
    four output macrocells, operatively coupled to the logic circuit and positioned for distributively outputting the combinatorial logic signals produced by the logic circuit out of the logic area perimeter respectively from the top, bottom, left and right portions of the logic area, each of the four output macrocells including means for distributively outputting said at least one variable-rich logic signal out from its respective top, bottom, left or right portion of the logic area.

10. A configurable logic array, comprising:
configuration storage means for storing program data specifying a user defined data processing function;
a plurality of configurable logic means $CL_{c,r}$, arranged in an array consisting of C columns and R rows, where c designates a column in the range 1 to C, and r designates a row in the range 1 to R, each of the configurable logic means $Cl_{c,r}$ having a plurality of inputs and outputs, and coupled to the configuration storage means, for generating cell output signals at the respective plurality of outputs in response to cell input signals supplied to the respective plurality of inputs and in response to program data in the configuration storage means;
a plurality of input/output means, each coupled to an input/output pad and having an input and an output, for providing interfaces between the respective input/output pads and the respective inputs and outputs;
configurable interconnect means, coupled to the plurality of configurable logic means, the plurality of input/output means and the configuration storage means, for connecting inputs and outputs of configurable logic means and input/output means into logical networks in response to program data in the configuration storage means, wherein the configurable interconnect means includes a set of horizontal buses $H_1$, extending across the array between the rows of configurable logic means, and a set of vertical buses $V_1$, extending across the array between the columns of configurable logic means;
wherein each configurable logic means $CL_{c,r}$ in a subset of the configurable logic means includes:
    input means, having interconnect inputs connected to horizontal buses $H_r$ and $H_{r+1}$ and to vertical buses $V_c$ and $V_{c+1}$, for supplying at least five input signals selected in response to program data in the configuration storage means from the interconnect inputs;
    logic means, connected to the input means, for generating logic signals in response to one or more of the input signals and program data in the configuration storage means, at least one of the generated logic signals being a variable-rich logic signal which is a function of at least five of the input signals; and output means, connected to the logic means and having interconnect outputs connected to horizontal buses $H_r$ and $H_{r+1}$ and to vertical buses $V_c$ and $V_{c+1}$, for supplying output signals selected from the logic signals in response to program data in the configuration storage means to the interconnect outputs;

wherein the output means in each member of the subset of configurable logic means includes a first output macrocell having an interconnect output connected to the horizontal bus $H_r$, a second output macrocell having an interconnect output connected to the vertical bus $V_{c+1}$ a third output macrocell having an interconnect output connected to the horizontal bus $H_{r+1}$, and a fourth output macrocell having an interconnect output connected to the vertical bus $V_c$; and wherein each of the first, second, third and fourth output macrocells comprises:

first selecting means, having a plurality of inputs connected to receive logic signals and an output, for selecting one of its plurality of inputs as its output, at least one input of the first selecting means receiving the variable-rich logic signal;

storing means, having an input connected to the output of the first selecting means and having an output, for storing a signal supplied to its input for supply to its output;

second selecting means, having an input connected to receive a logic signal, having an input connected to the output of the means for storing, and having an output, for selecting a signal at one of its inputs for supply to its output, at least one input of the second selecting means receiving the variable-rich logic signal; and buffer means, having an input connected to the output of the second selecting means and an output connected to a respective interconnect output, for driving a signal on its input to the interconnect output.

11. The configurable logic array of claim 10, wherein the logic means in each member of the subset of configurable logic means includes:

first level means for generating logic signals as a function of up to four input signals;

second level means for generating logic signals as a function of five input signals; and third level means for generating logic signals as a function of six input signals; and wherein the output means includes:

means for selecting independently output signals for each of the interconnect outputs connected to horizontal buses $H_r$ and $H_{r+1}$ and to vertical buses $V_c$ and $V_{c+1}$, from independent sets of signals, each independent set including logic signals generated by the first level means, the second level means, and the third level means.

12. The configurable logic array of claim 11, wherein the first level means further includes means for generating logic signals as a function of three input signals.

13. The configurable of logic array of claim 10, wherein the logic means in the subset of configurable logic means includes:

means for generating a plurality of intermediate logic signals, wherein each intermediate logic signal in the plurality is a function of a respective independent subset of the input signals, and means, receiving the plurality of intermediate logic signals, for generating a wide-gate logic signal as a function of the plurality of intermediate logic signals; and wherein the output means includes:

means for selecting independently output signals for each of the interconnect outputs connected to horizontal buses $H_r$ and $H_{r+1}$ and to vertical buses $V_c$ and $V_{c+1}$, from independent sets of logic signals, each independent set including logic signals generated by the logic means and the wide-gate logic signal.

14. The configurable logic array of claim 10, wherein the output means in each member o the subset of configurable logic means includes:

means, connected to the logic means and receiving at least one signal from the configurable interconnect means, for selecting independently output signals for each of the interconnect outputs connected to horizontal buses $H_r$ and $H_{r+1}$ and to vertical buses $V_c$ and $V_{c+1}$, from independent sets of signals, each independent set including logic signals generated by the logic means and the at least one signal from the configurable interconnect means.

15. The configurable logic array of claim 10, wherein the second selecting means includes:

a first multiplexer, having an input connected to the output of the means for storing and an input connected to an input of the first selecting means, and having an output;

a second multiplexer, having an input connected to the output of the first multiplexer and an input connected to receive a logic signal, and having an output connected to the input of the buffer means.

16. The configurable logic array of claim 10, wherein horizontal buses $H_r$ and $H_{r+1}$ and vertical buses $V_c$ and $V_{c+1}$ in the configurable interconnect means each include a respective plurality of long lines extending across the array; and wherein the input means in each member of the subset of configurable logic means includes interconnect inputs connected to each long line in the respective pluralities of long lines on horizontal buses $H_r$ and $H_{r+1}$ and on vertical buses $V_c$ and $V_{c+1}$; and wherein the output means in each member of the subset of configurable logic means includes interconnect outputs connected to each long line in the respective pluralities of long lines on horizontal buses $H_r$ and $H_{r+1}$ and on vertical buses $V_c$ and $V_{c+1}$.

17. The configurable logic array of claim 10, wherein horizontal buses $H_r$ and $H_{r+1}$ and vertical buses $V_c$ and $V_{c+1}$ in the configurable interconnect means each include a respective plurality of uncommitted long lines extending across the array; and wherein the output means in each member of the subset of configurable logic means includes interconnect outputs connected to each uncommitted long line in the respective pluralities of uncommitted long lines on horizontal buses $H_r$ and $H_{r+1}$ and on vertical buses $V_c$ and $V_{c+1}$.

18. The configurable logic array of claim 10, wherein the logic means in each member of the subset of configurable logic means includes:

first means, connected to receive a first subset of the input signals from the input means, for generating a logic signal in response the first subset and program data in the configuration storage means;

second means, connected to receive a second subset of the input signals from the input means, for generating a logic signal in response the second subset and program data in the configuration storage means;

third means, connected to receive a third subset of the input signals from the input means, for generating a logic signal in response the third subset and program data in the configuration storage means;

fourth means, connected to receive a fourth subset of the input signals from the input means, for generating a logic signal in response the fourth subset and program data in the configuration storage means; and means, connected to receive the logic signals generated in the first, second, third, and fourth means, for generating a logic signal in response to the logic signals generated in the first, second, third, and fourth means, a fifth subset of the input signals and program data in the configuration storage means;

and wherein the input means in each member of the subset of configurable logic means includes:

first selecting means, connected to a first subset of the interconnect inputs, for supplying the first subset of the input signals selected from at least the first subset of the interconnect inputs in response to program data in the configuration storage means;

second selecting means, connected to a second subset of the interconnect inputs, for supplying the second subset of the input signals selected from at least the second subset of the interconnect inputs in response to program data in the configuration storage means;

third selecting means, connected to a third subset of the interconnect inputs, for supplying the third subset of the input signals selected from at least the third subset of the interconnect inputs in response to program data in the configuration storage means;

fourth selecting means, connected to a fourth subset of the interconnect inputs, for supplying the fourth subset of the input signals selected from at least the fourth subset of the interconnect inputs in response to program data in the configuration storage means.

19. The configurable logic array of claim 18, wherein the logic means in each member of the subset further includes:

means, connected to receive the logic signals generated in the first, second, third, and fourth means, for generating a logic signal in response to the logic signals generated in the first, second, third, and fourth means, and program data in the configuration storage means.

* * * * *